(12) United States Patent
Ka et al.

(10) Patent No.: US 10,134,826 B2
(45) Date of Patent: Nov. 20, 2018

(54) DISPLAY APPARATUS INCLUDING DETOUR LINES

(71) Applicant: SAMSUNG DISPLAY CO., LTD., Yongin-si, Gyeonggi-Do (KR)

(72) Inventors: Ji-Hyun Ka, Asan-si (KR); Seung-Kyu Lee, Asan-si (KR); Hwan-Soo Jang, Asan-si (KR); Jin-Tae Jeong, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/404,661

(22) Filed: Jan. 12, 2017

(65) Prior Publication Data
US 2017/0294502 A1    Oct. 12, 2017

(30) Foreign Application Priority Data

Apr. 12, 2016  (KR) .......................... 10-2016-0045087

(51) Int. Cl.
*H01L 27/14* (2006.01)
*H01L 27/32* (2006.01)
*H01L 51/56* (2006.01)

(52) U.S. Cl.
CPC ...... *H01L 27/3276* (2013.01); *H01L 27/3248* (2013.01); *H01L 27/3258* (2013.01); *H01L 27/3262* (2013.01); *H01L 51/56* (2013.01)

(58) Field of Classification Search
CPC .................................................. H01L 27/3276
USPC ......................................................... 257/72
See application file for complete search history.

(56) References Cited

U.S. PATENT DOCUMENTS

| 2001/0055085 | A1* | 12/2001 | Jinno ..................... G02F 1/1345 349/139 |
| 2008/0225216 | A1* | 9/2008 | Shimodaira ........... G02F 1/1345 349/143 |
| 2010/0163880 | A1* | 7/2010 | Jeon .................. G02F 1/136204 257/59 |
| 2015/0115271 | A1* | 4/2015 | Yoon .................... H01L 27/0255 257/72 |
| 2017/0317158 | A1* | 11/2017 | Choi ..................... G09G 3/3233 |
| 2017/0358605 | A1* | 12/2017 | Choi ...................... H01L 27/124 |

FOREIGN PATENT DOCUMENTS

| KR | 1020080045637 | 5/2008 |
| KR | 1020110039773 | 4/2011 |

* cited by examiner

*Primary Examiner* — Jami V Miller
(74) *Attorney, Agent, or Firm* — F. Chau & Associates, LLC

(57) ABSTRACT

A display apparatus includes a substrate including a display area, a peripheral area surrounding the display area, a function-adding area, of which at least a portion is surrounded by the display area, and a detour area disposed between the display area and the function-adding area. The display apparatus includes a plurality of pixel circuits disposed in the display area. A plurality of driving lines are electrically connected to the pixel circuits and extend in a direction in the display area. A first detour line is disposed in the detour area and is electrically connected to a first driving line. A second detour line is disposed in the detour area. The second detour line is electrically connected to a second driving line and is disposed in a different layer from the first detour line.

24 Claims, 21 Drawing Sheets

DISPLAY APPARATUS INCLUDING DETOUR LINES

CROSS-REFERENCE TO RELATED APPLICATION

This application claims priority under 35 USC § 119 to Korean Patent Application No. 10-2016-0045087 filed on Apr. 12, 2016 in the Korean Intellectual Property Office (KIPO), the disclosure of which is incorporated by reference herein in its entirety.

TECHNICAL FIELD

Exemplary embodiments of the present invention relate to a display apparatus, and more particularly, to a display apparatus and a method of manufacturing the display apparatus.

DISCUSSION OF RELATED ART

A display apparatus may include a display area that emits a light to display an image, and a non-display area. For example, the non-display area may be a peripheral area surrounding the display area.

In the display apparatus, a size of the peripheral area may be reduced to achieve a relatively narrow bezel of the display apparatus. When the display apparatus having a relatively narrow bezel includes additional devices such as a camera module or a button module an area for the additional devices may penetrate into the display area so that a size of the display area is reduced.

Non-uniformity of connection wirings in an adjacent area to the additional devices may cause deterioration of a display image.

SUMMARY

Some exemplary embodiments of the present invention provide a display apparatus having an enlarged display area.

Some exemplary embodiments of the present invention provide a method for manufacturing a display apparatus having an enlarged display area.

According to an exemplary embodiment of the present invention, a display apparatus includes a substrate including a display area, a peripheral area surrounding the display area, a function-adding area, of which at least a portion is surrounded by the display area, and a detour area disposed between the display area and the function-adding area. The display apparatus includes a plurality of pixel circuits disposed in the display area. A plurality of driving lines are electrically connected to the pixel circuits and extend in a direction in the display area. A first detour line is disposed in the detour area and is electrically connected to a first driving line. A second detour line is disposed in the detour area. The second detour line is electrically connected to a second driving line and is disposed in a different layer from the first detour line.

In an exemplary embodiment of the present invention, the first and second detour lines may be adjacent to an edge of the function-adding area in a plan view.

In an exemplary embodiment of the present invention, the first and second detour lines are may be alternatingly arranged in a second direction crossing the first direction.

In an exemplary embodiment of the present invention, the driving lines may include data lines.

In an exemplary embodiment of the present invention, the display apparatus may include a scan line electrically connected to the pixel circuits in the display area and extending in a second direction crossing the first direction, and a third detour line electrically connected to the scan line and disposed in the detour area.

In an exemplary embodiment of the present invention, the third detour line may be disposed in a different layer from the scan line.

In an exemplary embodiment of the present invention, the scan line may include a first portion and a second portion spaced apart from the first portion by the detour area. The third detour line may electrically connect the first portion to the second portion.

In an exemplary embodiment of the present invention, the scan line may be electrically connected to a gate electrode of a switching transistor that receives a data signal through at least one of the data lines.

In an exemplary embodiment of the present invention, the display apparatus may include a power line electrically connected to the pixel circuits and extending in the first direction in the display area. A power bus line may extend in the second direction in the peripheral area. A detour bus line may be disposed in the detour area and may electrically connect the power line to the power bus line.

In an exemplary embodiment of the present invention, the detour bus line may be adjacent to the function-adding area in a plan view.

In an exemplary embodiment of the present invention, the power bus line may include a first portion and a second portion spaced apart from the first portion by the detour area. The detour bus line may electrically connect the first portion to the second portion.

In an exemplary embodiment of the present invention, the display apparatus may include an insulation structure that covers the pixel circuits and is disposed in the display area and the detour area. The insulation structure may include a gate insulation layer, an interlayer insulation layer and a via insulation layer, which are sequentially disposed above the substrate. Each of the pixel circuits may include an active pattern disposed under the gate insulation layer. A gate electrode may be disposed on the gate insulation layer and may overlap the active pattern. A source electrode may be disposed on the interlayer insulation layer and may be electrically connected to the active pattern. A drain electrode may be spaced apart from the source electrode. A pixel electrode may be disposed on the via insulation layer and may be electrically connected to the drain electrode.

In an exemplary embodiment of the present invention, the gate insulation layer may include a first gate insulation layer and a second insulation layer disposed on the first gate insulation layer. The first detour line may be disposed on the first gate insulation layer, and the second detour line may be disposed on the second gate insulation layer.

In an exemplary embodiment of the present invention, the third detour line may be disposed between the interlayer insulation layer and the via insulation layer.

In an exemplary embodiment of the present invention, the detour bus line may be disposed on the via insulation layer.

In an exemplary embodiment of the present invention, the first and second detour lines may extend into the peripheral area and may cross the power bus line.

In an exemplary embodiment of the present invention, the display apparatus may include a power line electrically connected to the pixel circuits and extending in the first direction in the display area. A power bus line may extend in the second direction in the peripheral area. A detour bus line may be disposed in the detour area and may electrically connect the power line to the power bus line. An insulation structure may cover the pixel circuits and may be disposed in the display area and the detour area. The insulation structure may include a gate insulation layer, an interlayer insulation layer and a via insulation layer, which are sequentially disposed above the substrate. The power line, the power bus line and the detour bus line may be disposed between the interlayer insulation layer and the via insulation layer.

In an exemplary embodiment of the present invention, the function-adding area may be defined by an opening passing through the substrate.

In an exemplary embodiment of the present invention, the display apparatus may include a light-emitting layer electrically connected to the pixel circuits.

According to an exemplary embodiment of the present invention, a method for manufacturing a display apparatus is provided. According to the method, a first gate pattern including a first detour line and a scan line is formed on a substrate. A gate insulation layer that covers the first gate pattern is formed. A second gate pattern including a second detour line is formed on the gate insulation layer. An interlayer insulation layer that covers the second gate pattern is formed. A source pattern is formed on the interlayer insulation layer. The source pattern includes a first data line electrically connected to the first detour line, a second data line electrically connected to the second detour line, and a third detour line electrically connected to the scan line and crossing the first detour line and the second detour line. A via insulation layer that covers the source pattern is formed.

According to an exemplary embodiment of the present invention, the substrate may include a function-adding area defined by an opening passing through the substrate. The first to third detour lines may be adjacent to an edge of the function-adding area in a plan view.

According to an exemplary embodiment of the present invention, the source pattern may include a power line extending in a same direction as the data lines. A power bus line may extend in a direction crossing the power line and may be electrically connected to the power line.

According to an exemplary embodiment of the present invention, a detour bus line may be formed on the via insulation layer. The via bus line may electrically connect the power line to the power bus line.

According the exemplary embodiment of the present invention, a plurality of detour lines that are respectively connected to a plurality of driving lines may be disposed in different layers in a detour area surrounding a function-adding area. Thus, a distance between the detour lines may be reduced and a size of the detour area may be reduced. Thus, a size of a display area may be increased.

According the exemplary embodiment of the present invention, a scan line may be electrically connected to a detour line disposed in the detour area. Thus, deterioration of display quality may be reduced or prevented.

According the exemplary embodiment of the present invention, a power line and a power bus line may be connected to each other through a detour bus line disposed in the detour area, which may prevent electrical disconnection, damage or voltage decrease by increased resistance of the power line.

BRIEF DESCRIPTION OF THE DRAWINGS

A more complete appreciation of the present inventive concept will become more apparent by describing in detail exemplary embodiments thereof with reference to the accompanying drawings, in which.

DETAILED DESCRIPTION OF THE EMBODIMENTS

Figure 1:
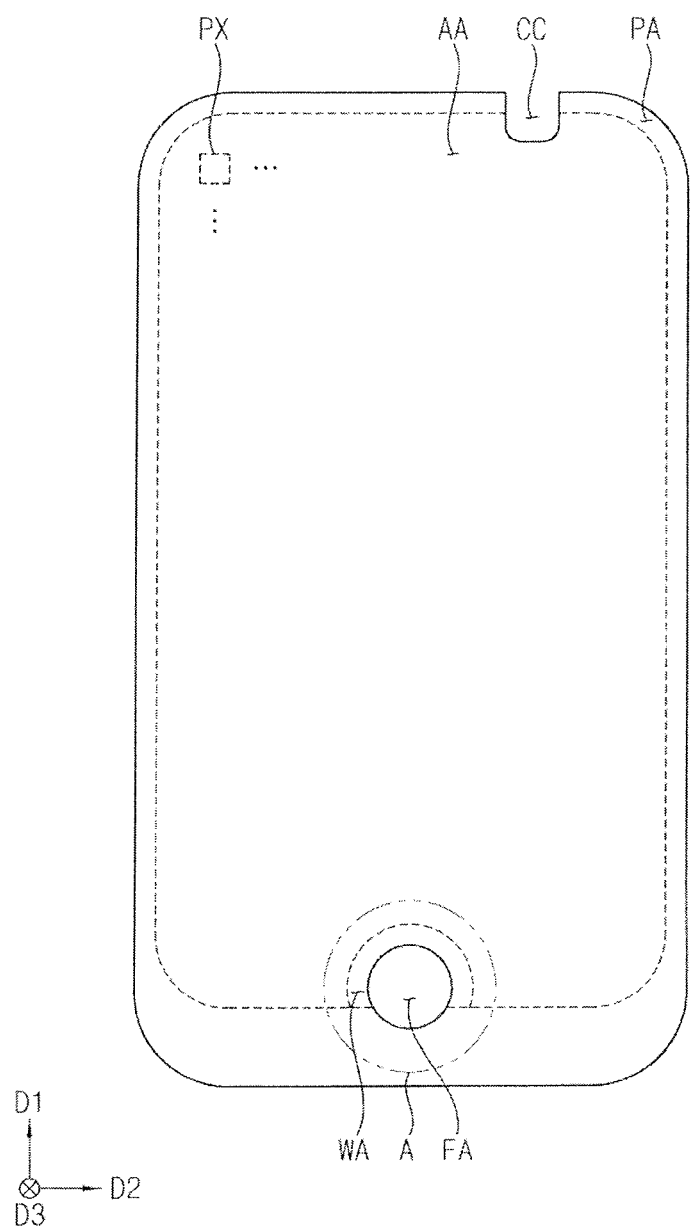
FIG. 1 is a plan view illustrating a display substrate according to an exemplary embodiment of the present invention.

Exemplary embodiments of the present invention will be described in more detail below with reference to the accompanying drawings, in which exemplary embodiments are illustrated. Exemplary embodiments of the present invention may, however, be embodied in many different forms and should not be construed as limited to the embodiments set forth herein. Like reference numerals may refer to like elements throughout the specification and drawings FIG. 1 is a plan view illustrating a display substrate according to an exemplary embodiment of the present invention.

Figure 2:
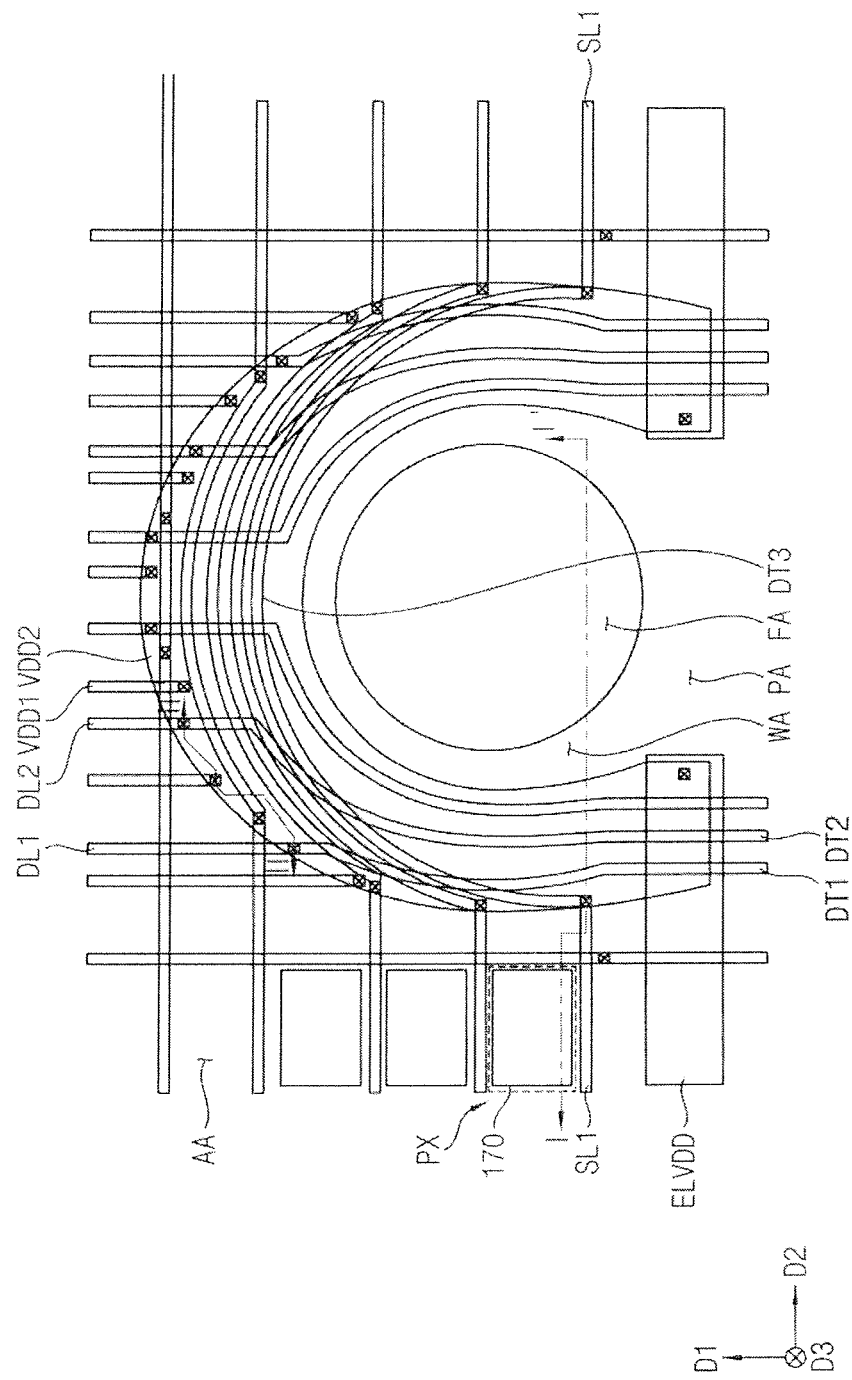
FIG. 2 is an enlarged plan view illustrating the region 'A' of FIG. 1.
Figure 3:
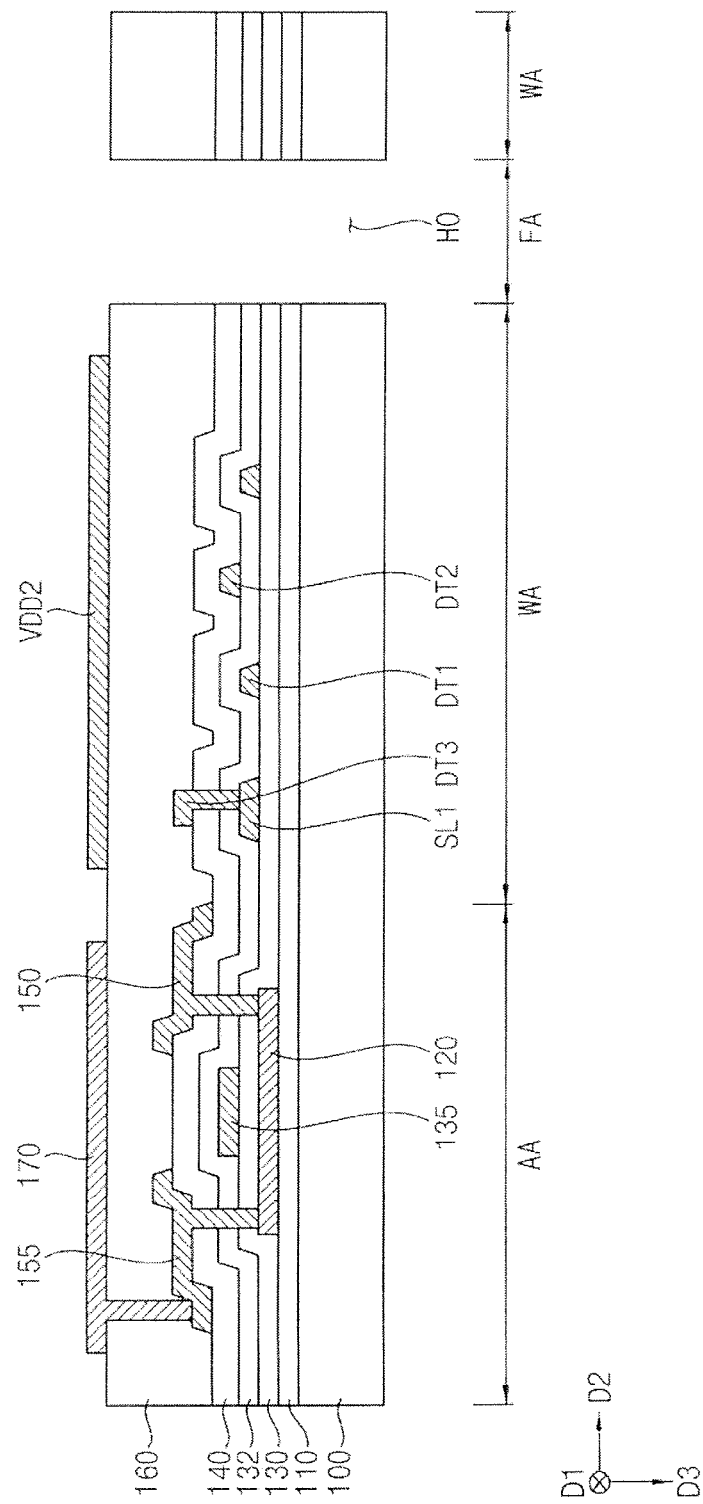
FIG. 3 is a cross-sectional view taken along the line I-I' of FIG. 2.
Figure 4:
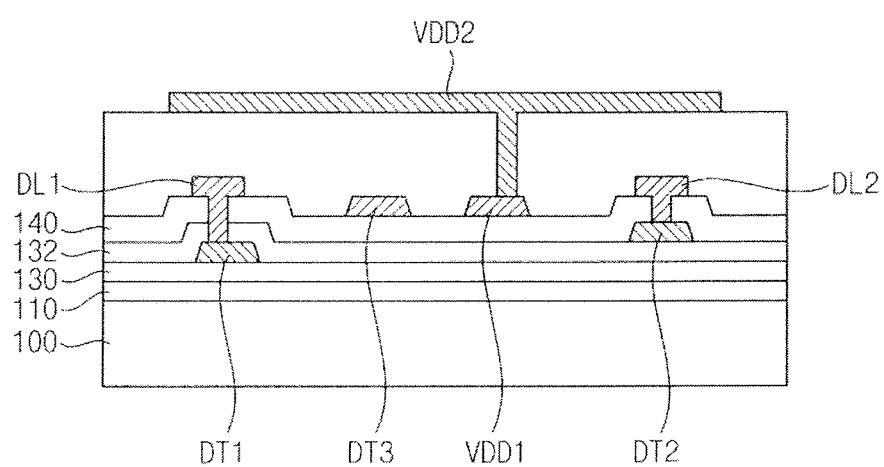
FIG. 4 is a cross-sectional view taken along the line II-II' of FIG. 2.
Figure 5:
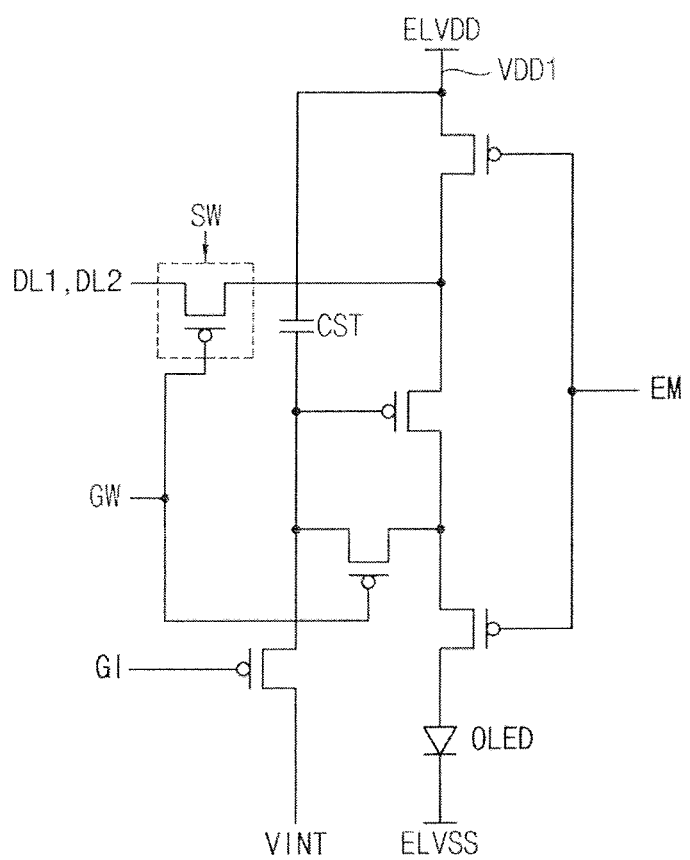
FIG. 5 is a circuit diagram illustrating a pixel circuit of a display substrate according to an exemplary embodiment.

FIG. 2 is an enlarged plan view illustrating the region 'A' of FIG. 1. FIG. 3 is a cross-sectional view taken along the line I-I' of FIG. 2. FIG. 4 is a cross-sectional view taken along the line II-II' of FIG. 2. FIG. 5 is a circuit diagram illustrating a pixel circuit of a display substrate according to an exemplary embodiment of the present invention.

Referring to FIGS. 1 to 5, a display substrate may include a base substrate 100, a pixel circuit, an insulation structure, a pixel electrode 170, a driving line, and a detour line.

The base substrate 100 may include a display area AA, a peripheral area PA, a function-adding area FA and a detour area WA.

The display area AA may be an area where an image is displayed, and a plurality of pixels PX may be arranged in the display area AA. For example, the display area AA may include at least one red pixel, at least one green pixel and at least one blue pixel, which are adjacent to each other and are alternately and sequentially arranged. Each of the pixels PX may include a pixel circuit.

The peripheral area PA is an area where an image is not displayed, and may be adjacent to the display area AA. For example, the peripheral area PA may have a shape surrounding the display area AA. A driving part that provides a driving signal to each of the pixels PX may be disposed in the peripheral area PA. For example, the driving part may include a data driving part, a scan driving part and a light-emitting driving part. The driving part may be disposed on an IC chip or may be disposed on the base substrate 100.

The function-adding area FA may be an area where an image is not displayed, and at least a portion of the function-adding area FA may be surrounded by the display area AA. For example, the function-adding area FA may be a non-display area recessed from a boundary line of the display area AA.

For example, the function-adding area FA may be defined by an opening HO passing through the base substrate 100. For example, the opening HO may overlap the display area AA and the peripheral area PA.

For example, a button module or a camera module may be positioned in the function-adding area FA.

The detour area WA may be an area where an image is not displayed, and may be disposed between the function-adding area FA and the display area AA. Wirings for electrically connecting the driving part to the pixels PX may be disposed in the detour area WA.

In an exemplary embodiment of the present invention, the function-adding area FA may be a button area disposed in a lower portion of the display substrate, but exemplary embodiments of the present invention are not limited thereto. For example, the function-adding area FA may be defined by a camera area CC disposed in an upper portion of the display substrate, and an area surrounding the camera area CC may define the detour area WA.

In an exemplary embodiment of the present invention, a plurality of data lines DL1 and DL2 extending in a first direction D1, and a plurality of scan lines SL1 extending in a second direction D2 crossing the first direction D1 may be disposed in the display area AA.

A transistor such as a thin film transistor, which is included in the pixel circuit, may be disposed in each of the pixels PX. The thin film transistor may be electrically connected to a corresponding data line and a corresponding gate line.

The pixel circuit may be electrically connected to a power line VDD1. The power line VDD1 may be parallel to the data lines DL1 and DL2.

The data lines (e.g., data lines DL1 and DL2) and the power lines (e.g., power line VDD1) may be referred to as driving lines.

One transistor may be disposed in each of the pixels PX; however, exemplary embodiments of the present invention are not limited thereto. For example, at least two transistors may be disposed in each of the pixels PX. For example, each of the pixels PX may include a plurality of transistors including a switching transistor SW, and a storage capacitor Cst.

The pixel circuit may be electrically connected to a gate-writing line GW, a voltage-initializing line Vint, a gate-initializing line GI, a first power line VDD1, a second power line and an emission control line EM. The gate-writing line GW may be connected to a gate electrode of the switching transistor SW connected to the data line. The voltage-initializing line Vint may provide an initializing voltage. The gate-initializing line GI may control a transistor connected to the voltage-initializing line Vint. The first power line VDD1 may provide a first power voltage ELVDD to an organic light-emitting diode OLED. The second power lines may provide a second power voltage ELVSS to the organic light-emitting diode OLED. The emission control line EM may provide an emission signal to the organic light-emitting diode OLED. The organic light-emitting diode OLED may include a pixel electrode, a light-emitting layer and an opposing electrode.

In an exemplary embodiment of the present invention, a first detour line DT1 and a second detour line DT2 may be disposed in the detour area WA. The first detour line DT1 and the second detour line DT2 may be disposed in different layers. The first detour line DT1 may be electrically connected to a first driving line disposed in the display area AA. The second detour line DT2 may be electrically connected to a second driving line disposed in the display area AA.

In an exemplary embodiment of the present invention, the detour area WA may have a ring shape or a half ring shape, which surrounds the function-adding area FA. The first detour line DT1 and the second detour line DT2 may extend along an edge of the function-adding area FA. For example, the first detour line DT1 and the second detour line DT2 may have a shape that curves or bends along the edge of the function-adding area FA in a plan view.

The first detour line DT1 and the second detour line DT2 may have different lengths. For example, when the second detour line DT2 is closer to the function-adding area FA than the first detour line DT1 is, a length of the first detour line DT1 may be longer than a length of the second detour line DT2.

When the first detour line DT1 and the second detour line DT2 are disposed in a same layer, the first detour line DT1 and the second detour line DT2 may be relatively close together. For example, the first detour line DT1 and the second detour line DT2 may be relatively close together as a result of an exposure process. In an exemplary embodiment of the present invention, the first detour line DT1 and the second detour line DT2 may be disposed in different layers from each other. The first detour line DT1 and the second detour line DT2 may be alternatingly arranged along the second direction D2. Thus, a distance between the first detour line DT1 and the second detour line DT2 disposed on different layers from each other may be reduced. For example, the distance between the first detour line DT1 and the second detour line DT2 according to an exemplary embodiment of the present invention may be less than a distance between a first detour line and a second detour line formed by an exposure process forming the first and second detour lines on a same level. Thus, a size of the detour area WA, which is a non-display area, may be reduced when first detour line DT1 and the second detour line DT2 are disposed in different layers.

In an exemplary embodiment of the present invention, a third detour line DT3 may be disposed in the detour area WA. The third detour line DT3 may be electrically connected to the scan line SL1 that extends in the second direction D2 in the display area AA. The scan line SL1 may include a first portion and a second portion spaced apart from the first portion by the function-adding area FA. The third detour line DT3 may be connected to the first portion and the second portion. The third detour line DT3 may be disposed in a different layer from the first and second detour lines DT1 and DT2 (see, e.g., FIG. 4), and may cross the first and second detour lines DT1 and DT2.

For example, the third detour line DT3 may extend along the edge of the function-adding area FA. For example, the third detour line DT3 may have a shape that curves or bends along the edge of the function-adding area FA in a plan view.

When the scan line SL1 is divided by the function-adding area FA, the divided first and second portions may be connected to gate driving parts disposed at both sides of the peripheral area PA to be operated.

However, when the scan line SL1 is divided by the function-adding area FA, or when the divided first and second portions have different lengths from each other, voltage variation of signals applied to the pixel circuits may be increased by RC difference between the divided scan line and other scan lines that are not divided. Thus, a displayed image may be deteriorated.

For example, the scan line SL1 may include a line that extends in the second direction D2 in the display area AA, for example, at least one of the gate-writing line GW, the voltage-initializing line Vint, the gate-initializing line GI and the emission control line EM.

In an exemplary embodiment of the present invention, the scan line SL1 may be the gate-writing line GW. A voltage variation occurring between divided portions of the gate-writing line GW may affect image quality. Thus, when the gate-writing line GW is continuously connected by the third detour line DT3, and when other lines, for example, the voltage-initializing line Vint, the gate-initializing line GI and the emission control line EM are respectively divided into a plurality of portions that are separately driven, the number of detour lines disposed in the detour area WA may be reduced. Thus, image deterioration may be reduced or prevented and a size of the detour area WA may be reduced.

In an exemplary embodiment of the present invention, a detour bus line VDD2 may be disposed in the detour area WA. A power bus line ELVDD may be disposed in the peripheral area PA. The detour bus line VDD2 may be electrically connected to the power bus line ELVDD disposed in the peripheral area PA. The detour bus line VDD2 and the power bus line ELVDD may have a width greater than the power line VDD1.

In an exemplary embodiment of the present invention, the power bus line ELVDD may extend in the second direction D2, and may include a first portion and a second portion spaced apart from the first portion by the function-adding area FA. The detour bus line VDD2 may be connected to the first portion and the second portion of the power bus line ELVDD.

For example, the detour bus line VDD2 may extends along the edge of the function-adding area FA. For example, the detour bus line VDD2 may have a shape that curves or bends along the edge of the function-adding area FA. The detour bus line VDD2 may overlap the first to third detour lines DT1, DT2 and DT3 in the detour area WA, and may be disposed in a different layer from the first to third detour lines DT1, DT2 and DT3.

When the power lines VDD1 adjacent to the function-adding area FA are not directly connected to the power bus line ELVDD or the detour bus line VDD2, the power lines VDD1 may be connected to adjacent power lines with a mesh structure, and thus a between the power lines VDD1 and the power bus line ELVDD may be increased. Thus, disconnection or damage may be caused by burning due to increased resistance, or voltage variation applied to the pixel circuits may be increased.

In an exemplary embodiment of the present invention, the detour bus line VDD2 may be connected to the power lines VDD1 adjacent to the function-adding area FA. Thus, a power may be stably applied to the power lines VDD1.

In an exemplary embodiment of the present invention, the first and second detour lines DT1 and DT2 may extend into the peripheral area PA and may cross the power bus line ELVDD.

The transistor and the capacitor may be disposed on a barrier layer 110 formed on the base substrate 100 in the display area AA. The transistor may include an active pattern 120, a gate electrode 135, a source electrode 150 and a drain electrode 155. The transistor may be a driving transistor that provides a driving power to a light-emitting element.

A via insulation layer 160 may cover the transistor. For example, a pixel electrode 170 electrically connected to the drain electrode 155 of the transistor may be disposed on the via insulation layer 160.

The base substrate 100 may be an insulation substrate. For example, the base substrate 100 may include a polymeric material. For example, the base substrate 100 may include a polymer such as polyimide, polysiloxane, epoxy resin, acrylic resin, or polyester. In an exemplary embodiment of the present invention, the base substrate 100 may include polyimide.

As an example, the base substrate 100 may be a glass substrate or a quartz substrate.

The barrier layer 110 may be conformally disposed along an upper surface of the base substrate 100. The barrier layer 110 may reduce or prevent an entrance of humidity into the display substrate, and may reduce or prevent a diffusion of impurities between the base substrate 100 and a structure formed on the base substrate 100.

For example, the barrier layer 110 may be disposed in the display area AA and the detour area WA of the base substrate 100.

The barrier layer 110 may include silicon oxide, silicon nitride or silicon oxynitride, or a combination thereof. The barrier layer 110 may have a stacked structure including a silicon oxide layer and a silicon nitride layer.

The active pattern 120 may be disposed on the barrier layer 110. The active pattern 120 may include a silicon compound such as polysilicon. In an exemplary embodiment of the present invention, a source region and a drain region, which include impurities of p-type or n-type, may be disposed at opposite ends of the active pattern 120.

In an exemplary embodiment of the present invention, the active pattern 120 may include an semiconductive oxide such as indium gallium zinc oxide (IGZO), zinc tin oxide (ZTO), or indium tin zinc oxide (ITZO).

A first gate insulation layer 130 and a second gate insulation layer 132 may be disposed on the barrier layer 110. The first gate insulation layer 130 and the second gate insulation layer 132 may cover the active pattern 120. In an exemplary embodiment of the present invention, the first and second gate insulation layers 130 and 132 may include silicon oxide, silicon nitride or silicon oxynitride. In an exemplary embodiment of the present invention, the first gate insulation layer 130 may include a silicon oxide layer, and the second gate insulation layer 132 may include a silicon nitride layer.

The first and second gate insulation layers 130 and 132 may be disposed in the display area AA and the detour area WA.

The gate electrode 135 may be disposed on the first gate insulation layer 130. The gate electrode 135 may be disposed between the first gate insulation layer 130 and the second gate insulation layer 132, and may substantially overlap the active pattern 120.

For example, the gate electrode 135 may include a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) or scandium (Sc), an alloy thereof, a nitride thereof, or a combination thereof. The gate electrode 135 may have a stacked structure including at least two metal layers that are physically or chemically different from each other. For example, the gate electrode 135 may have a stacked structure of Al/Mo or Ti/Cu, which may reduce an electrical resistance of the gate electrode 135.

The gate electrode 135 may be formed from a same layer as the scan line SL1. Thus, the scan line SL1 may be disposed between the first gate insulation layer 130 and the second gate insulation layer 132.

In an exemplary embodiment of the present invention, a storage electrode including a storage capacitor Cst may be disposed between the second gate insulation layer 132 and an interlayer insulation layer 140.

The interlayer insulation layer 140 may be disposed on the second gate insulation layer 132 and may cover the gate electrode 135. The interlayer insulation layer 140 may include silicon oxide, silicon nitride or silicon oxynitride. In an exemplary embodiment of the present invention, the interlayer insulation layer 140 may have a stacked structure including a silicon oxide layer and a silicon nitride layer.

The interlayer insulation layer 140 may be disposed in the display area AA and the detour area WA.

The source electrode 150 and the drain electrode 155 may pass through the interlayer insulation layer 140 and the first and second gate insulation layers 130 and 132 to contact the active pattern 120. As an example, the source electrode 150 and the drain electrode 155 may include a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) or scandium (Sc), an alloy thereof, a nitride thereof, or a combination thereof. For example, the source electrode 150 and the drain electrode 155 may have a stacked structure including at least two metal layers that are physically or chemically different from each other, such as Al/Mo.

The source electrode 150 and the drain electrode 155 may respectively contact the source region and the drain region of the active pattern 120. A region between the source region and the drain region may be a channel through which an electron moves.

The data lines DL1 and DL2 may be formed from a same layer as the source electrode 150 and the drain electrode 155. Thus, the data lines DL1 and DL2 may be disposed between the interlayer insulation layer 140 and the via insulation layer 160.

The power line VDD1 and the power bus line ELVDD may be formed from a same layer as the source electrode 150 and the drain electrode 155. Thus, the power line VDD1 and the power bus line ELVDD may be disposed between the interlayer insulation layer 140 and the via insulation layer 160.

While a transistor having a top-gate structure in which the gate electrode 135 is disposed on the active pattern 120 is illustrated in FIG. 3, exemplary embodiments of the present invention are not limited thereto. For example, the transistor may have a bottom-gate structure in which the gate electrode 135 is disposed under the active pattern 120.

The via insulation layer 160 may be disposed on the interlayer insulation layer 140 and may cover the source electrode 150 and the drain electrode 155. The via insulation layer 160 may include a through hole electrically connecting the pixel electrode 170 and the drain electrode 155. The via insulation layer 160 may function as a flattening layer for the display substrate.

As an example, the via insulation layer 160 may include an organic material such as polyimide, phenol resin, epoxy resin, acrylic resin, or polyester.

The pixel electrode 170 may be disposed on the via insulation layer 160, and may contact the drain electrode 155 through the via insulation layer 160. The pixel electrode 170 may be disposed in the display area AA, and may be independently disposed in each of the pixels PX.

For example, the pixel electrode 170 may include indium tin oxide, indium zinc oxide, zinc oxide, or indium oxide.

In an exemplary embodiment of the present invention, the pixel electrode 170 may be a reflective electrode. When the pixel electrode 170 is a reflective electrode, the pixel electrode 170 may include a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) or scandium (Sc), or an alloy thereof.

In an exemplary embodiment of the present invention, the pixel electrode 170 may have a stacked structure including a transparent conductive material and a metal.

The insulation structure may include the first and gate insulation layers 130 and 132, the interlayer insulation layer 140 and the via insulation layer 160.

The first detour line DT1 may be disposed in a different layer from the second detour line DT2. For example, the first detour line DT1 may be disposed in a same layer as the scan line SL1 or the gate electrode 135. Thus, the first detour line DT1 may be disposed between the first gate insulation layer 130 and the second gate insulation layer 132.

As an example, the second detour line DT2 may be disposed between the second gate insulation layer 132 and the via insulation layer 140.

The first detour line DT1 may be electrically connected to the first data line DL1. For example, an end of the first data line DL1 may overlap an end of the first detour line DT1, and the end of the first data line DL1 may pass through the interlayer insulation layer 140 and the second gate insulation layer 132 to contact the end of the first detour line DT1.

The second detour line DT2 may be electrically connected to the second data line DL2. For example, an end of the second data line DL2 may overlap an end of the second detour line DT2, and the end of the second data line DL2 may pass through the via insulation layer 140 to contact the end of the second detour line DT2.

The third detour line DT3 may be disposed in a different layer from the first and second detour lines DT1 and DT2. For example, the third detour line DT3 may be disposed in a same layer as the data lines DL1 and DL2. Thus, the third detour line DT3 may be disposed between the interlayer insulation layer 140 and the via insulation layer 160.

The third detour line DT3 may be electrically connected to the scan line SL1. For example, an end of the third detour line DT3 may overlap an end of the scan line SL1, and the end of the third detour line DT3 may pass through the interlayer insulation layer 140 and the second gate insulation layer 132 to contact the end of the scan line SL1.

The detour bus line VDD2 may be disposed in a different layer from the first to third detour lines DT1, DT2 and DT3. For example, the detour bus line VDD2 may be disposed in a same layer as the pixel electrode 170. Thus, the detour bus line VDD2 may be disposed on the via insulation layer 160.

An end of the detour bus line VDD2 may pass through the via insulation layer 160 to contact an end of the power line VDD1. The detour bus line VDD2 may be electrically connected to the power line VDD1.

Figure 6:
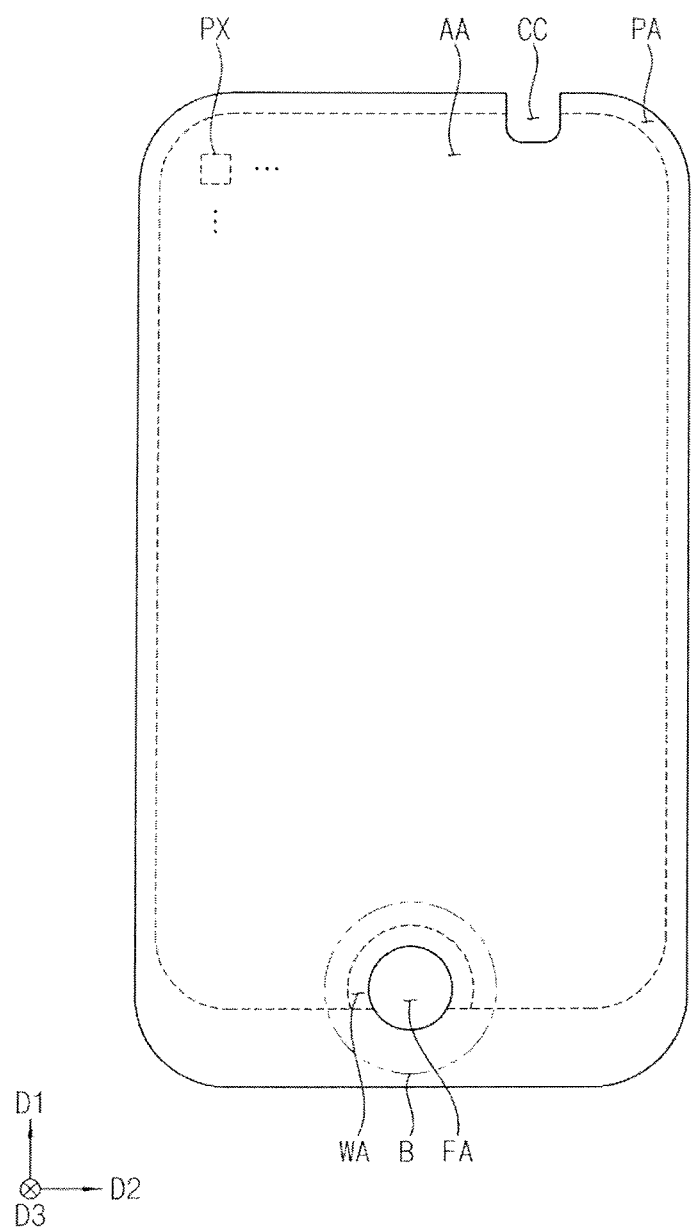
FIG. 6 is a plan view illustrating a display substrate according to an exemplary embodiment of the present invention.
Figure 7:
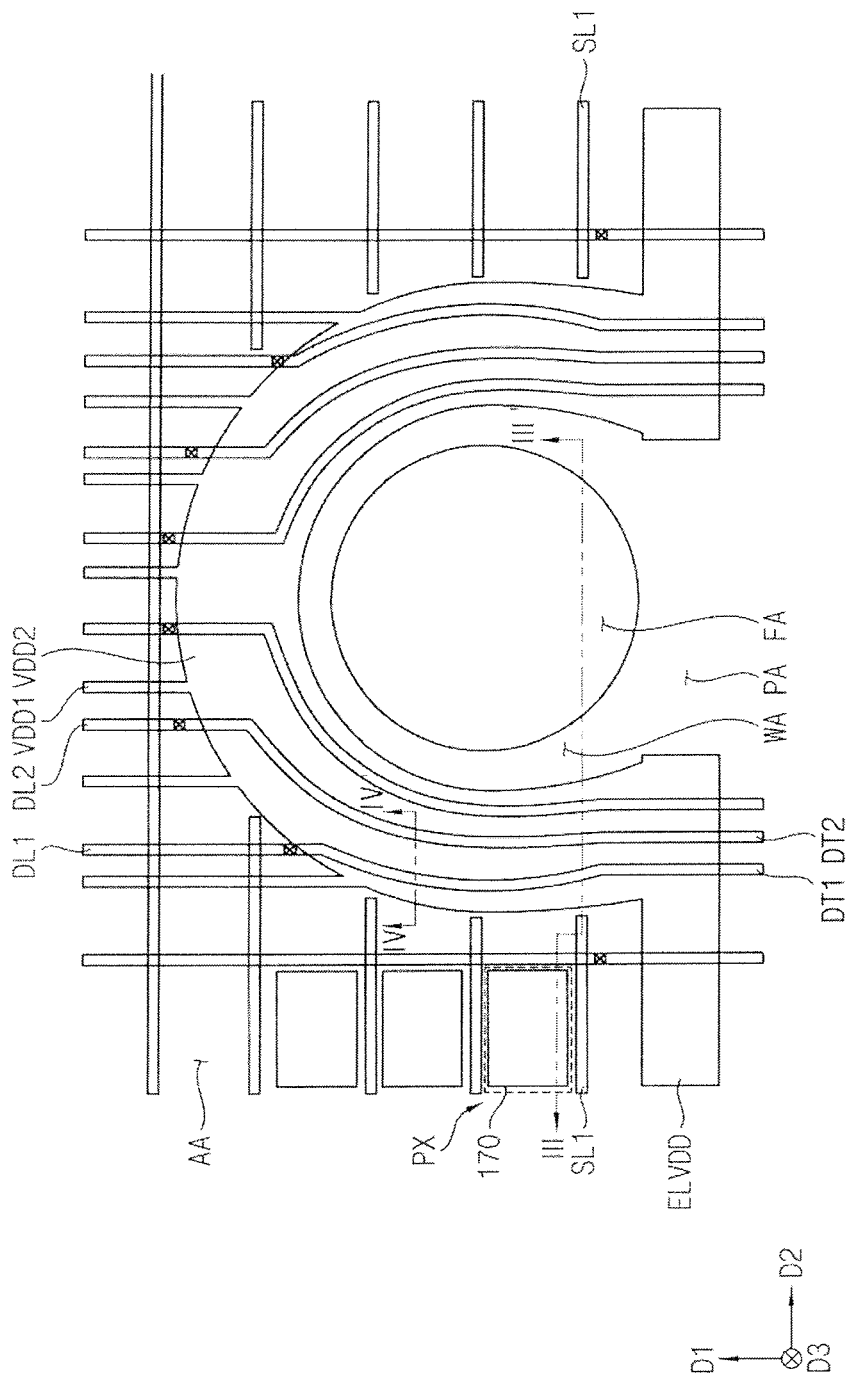
FIG. 7 is an enlarged plan view illustrating the region 'B' of FIG. 6.
Figure 8:
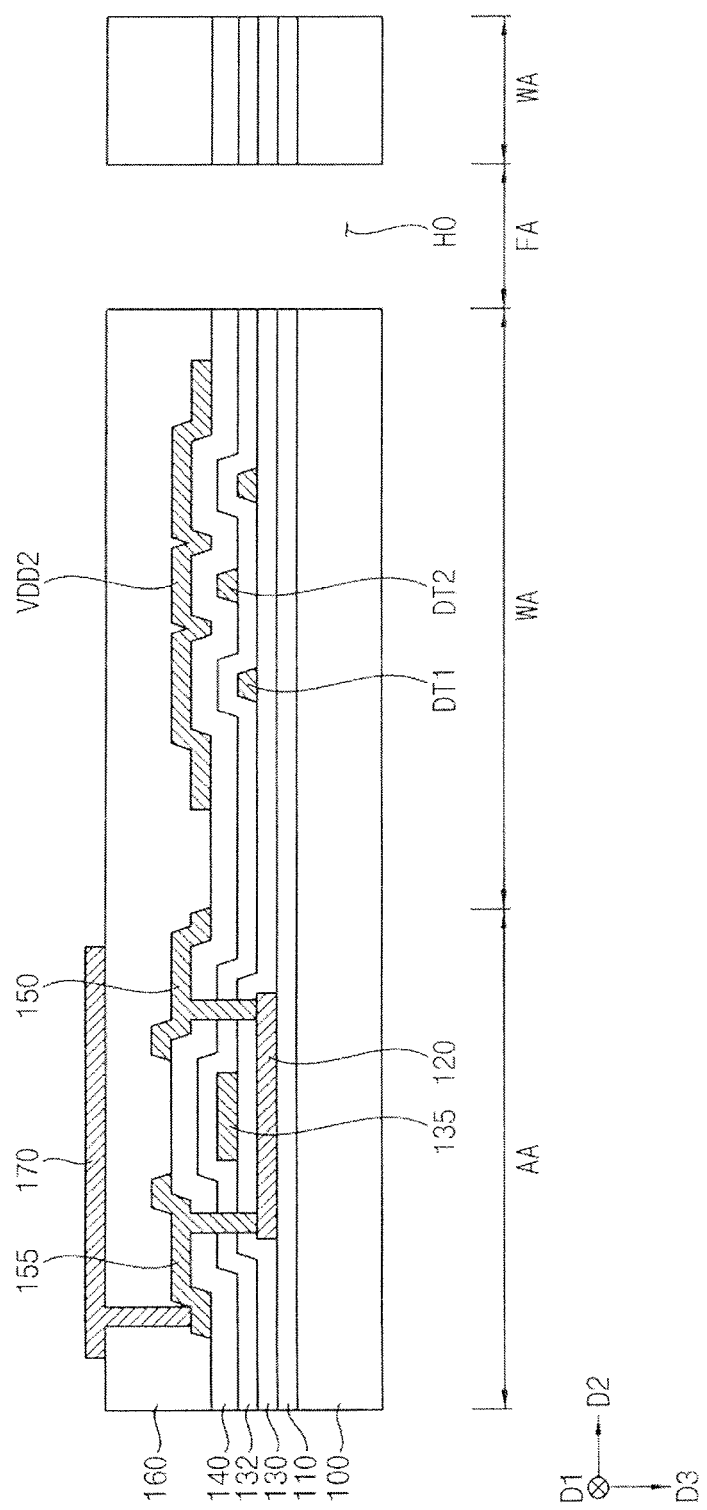
FIG. 8 is a cross-sectional view taken along the line of FIG. 7.
Figure 9:
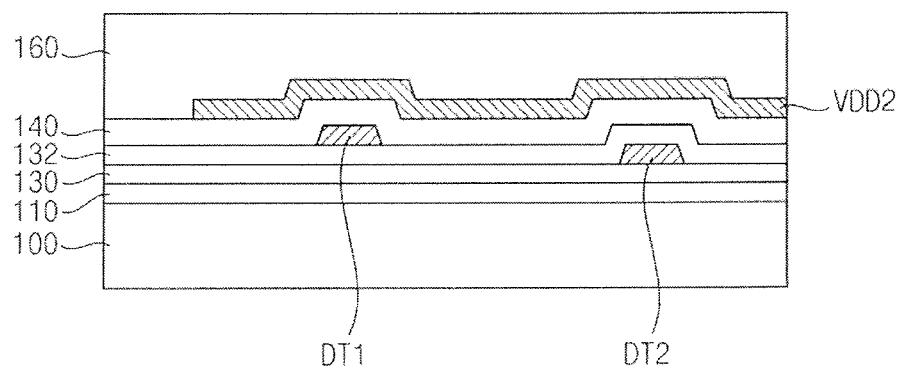
FIG. 9 is a cross-sectional view taken along the line IV-IV' of FIG. 7.

FIG. 6 is a plan view illustrating a display substrate according to an exemplary embodiment of the present invention. FIG. 7 is an enlarged plan view illustrating the region 'B' of FIG. 6. FIG. 8 is a cross-sectional view taken along the line of FIG. 7. FIG. 9 is a cross-sectional view taken along the line IV-IV' of FIG. 7. Any repeated explanation for elements that are the same as or similar to those described in more detail with reference to FIGS. 1 to 5 may be omitted.

Referring to FIGS. 6 to 9, a display substrate may include a driving line electrically connected to a pixel circuit in the display area AA, and a detour line that passes through an insulation structure to be electrically connected to the driving line.

For example, the driving line may be disposed in the display area AA, and may be disposed on the interlayer insulation layer 140 of the insulation structure. The detour line may be disposed in the detour area WA, and may be disposed on the first gate insulation layer 130 or the second gate insulation layer 132 of the insulation structure. In an exemplary embodiment of the present invention, the detour line may have a shape extending along an end of a function-adding area FA defined by the opening HO.

In an exemplary embodiment of the present invention, the driving line may include the plurality of data lines DL1 and DL2 that extend in the first direction D1. The first detour line DT1 may be electrically connected to the first data line DL1, and the second detour line DT2 may be electrically connected to the second data line DL2. The first detour line DT1 and the second detour line DT2 may be disposed in different layers from each other. For example, the first detour line DT1 and the second detour line DT2 may be alternatingly arranged in a direction (e.g., the second direction D2).

The first detour line DT1 may be disposed in a different layer from the second detour line DT2. For example, the first detour line DT1 may be disposed in a same layer as the scan line SL1 or the gate electrode 135. Thus, the first detour line DT1 may be disposed between the first gate insulation layer 130 and the second gate insulation layer 132.

For example, the second detour line DT2 may be disposed between the second gate insulation layer 132 and the interlayer insulation layer 140.

In an exemplary embodiment of the present invention, the display substrate might not include the third detour line electrically connecting divided portions of the scan line SL1 to each other. The divided portions of the scan line SL1 may be driven by scan driving parts disposed at both sides of the peripheral area PA. Omitting the detour line that connects the scan line SL1 may reduce a size of the detour area WA.

In the peripheral area PA that surrounds the display area AA, the power bus line ELVDD extending in the second direction D2 crossing the first direction D1 may be disposed. The detour bus line VDD2 that extends along an end of the function-adding area FA and is connected to the power bus line ELVDD and the power line VDD1 may be disposed in the detour area WA.

In an exemplary embodiment of the present invention, the display substrate might not include the detour line connecting divided portions of the scan line SL1 to each other. Thus, the detour bus line VDD2 may be formed from a source pattern. Thus, the power bus line ELVDD, the detour bus line VDD2 and the power line VDD1 may be formed from a same layer, and may be continuously connected to each other in a same layer.

Figure 10:
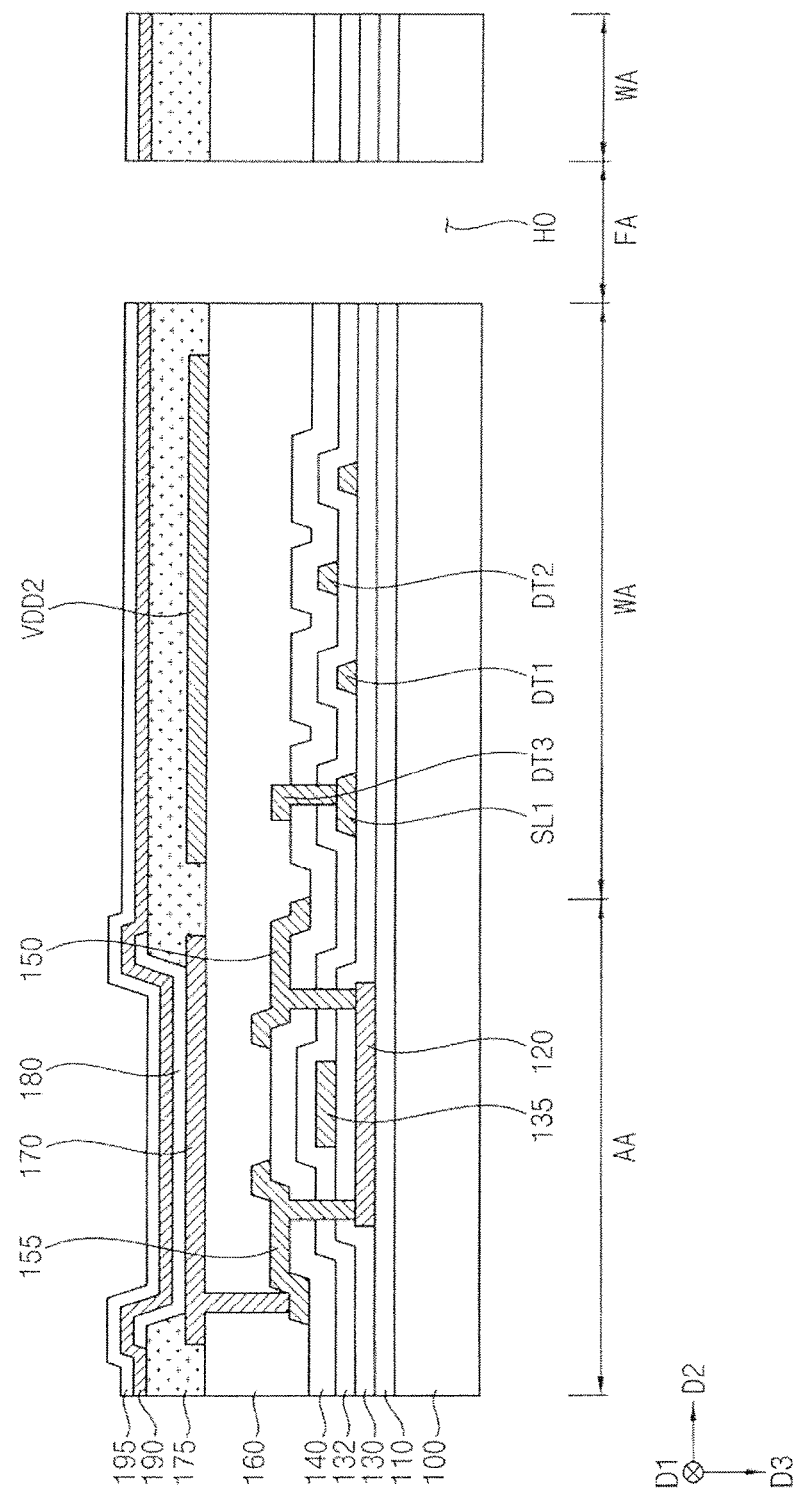
FIG. 10 is a cross-sectional view illustrating a display apparatus according to an exemplary embodiment of the present invention.

FIG. 10 is a cross-sectional view illustrating a display apparatus according to an exemplary embodiment of the present invention. For example, FIG. 10 illustrates an organic light-emitting display apparatus including the display substrate described in more detail above with reference to FIGS. 1 to 5.

Any repeated explanation for elements that are the same as or similar to those described in more detail with reference to FIGS. 1 to 5 may be omitted.

Referring to FIG. 10, the display apparatus may include a light-emitting layer 180, an opposing electrode 190 and an encapsulation layer 195, which may be disposed on the display substrate described in more detail with reference to FIGS. 1-5. A pixel-defining layer 175 may be disposed on the via insulation layer 160 in the display area AA. The pixel-defining layer 175 may expose at least a portion of the pixel electrode 170 disposed in each of pixels.

For example, the pixel-defining layer 175 may cover a peripheral portion of the pixel electrode 170. The pixel-defining layer 175 may include a transparent organic material such as polyimide resin, or acrylic resin. A size of the portion of the pixel electrode 170 not covered by the pixel-defining layer 175 may define a size of a light-emitting area for each pixel.

The light-emitting layer 180 may be disposed on the pixel-defining layer 175 and the pixel electrode 170. The light-emitting layer 180 may include an organic light-emitting layer that is individually patterned for a red pixel, a green pixel and a blue pixel to generate light having different colors. The organic light-emitting layer may include a host material, which is excited by an electron and a hole, and a dopant material, which increases a light-emitting efficiency by absorbing and emitting energy.

In an exemplary embodiment of the present invention, the display apparatus may include a liquid crystal layer instead of the light-emitting layer 180 and thus the display apparatus may be included in a liquid crystal display.

Referring to FIG. 10, the light-emitting layer 180 may be disposed on an upper surface of the pixel electrode 170, which is exposed by an opening of the pixel-defining layer 175, and on a side surface of the pixel-defining layer 175. The light-emitting layer 180 may be disposed on an upper surface of the pixel-defining layer 175. In an exemplary embodiment of the present invention, the light-emitting layer 180 may be divided by a sidewall of the pixel-defining layer 175 and may be disposed on each of the pixels.

The opposing electrode 190 may be disposed on the light-emitting layer 180. The opposing electrode 190 and the pixel electrode 170 may face each other through the light-emitting layer 180 disposed between the opposing electrode 190 and the pixel electrode 170.

In an exemplary embodiment of the present invention, the opposing electrode 190 may be a common electrode that continuously extends over a plurality of the pixels. The pixel electrode 170 and the opposing electrode 190 may respectively be an anode and a cathode of the display apparatus, or vice versa.

As an example, the opposing electrode 190 may include a metal having a low work function such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) or scandium (Sc), magnesium (Mg), or an alloy thereof. The opposing electrode 190 may include a transparent conductive material such as indium tin oxide, indium zinc oxide, zinc oxide, or indium oxide.

In an exemplary embodiment of the present invention, the opposing electrode 190 may be disposed in the display area AA and the detour area WA. For example, the opposing electrode 190 may be conformally disposed along surfaces of the pixel-defining layer 175 and the light-emitting layer 180.

In an exemplary embodiment of the present invention, the display apparatus may be a top-emission type display apparatus displaying an image upwardly through the opposing electrode 190. In the top-emission type display apparatus, the pixel electrode 170 may include a metal and the pixel electrode 170 may be a reflective electrode. The opposing electrode 190 may include a transparent conductive material such as indium tin oxide.

The encapsulation layer 195 may be disposed on the opposing electrode 190 and may protect the display apparatus. As an example, the encapsulation layer 195 may include an inorganic material such as silicon oxide and/or a metal oxide. In an exemplary embodiment of the present invention, a capping layer may be disposed between the opposing electrode 190 and the encapsulation layer 195. The capping layer may include an organic material such as polyimide resin, epoxy resin, or acrylic resin, or an inorganic material such as silicon oxide, silicon nitride, or silicon oxynitride.

Figure 11:
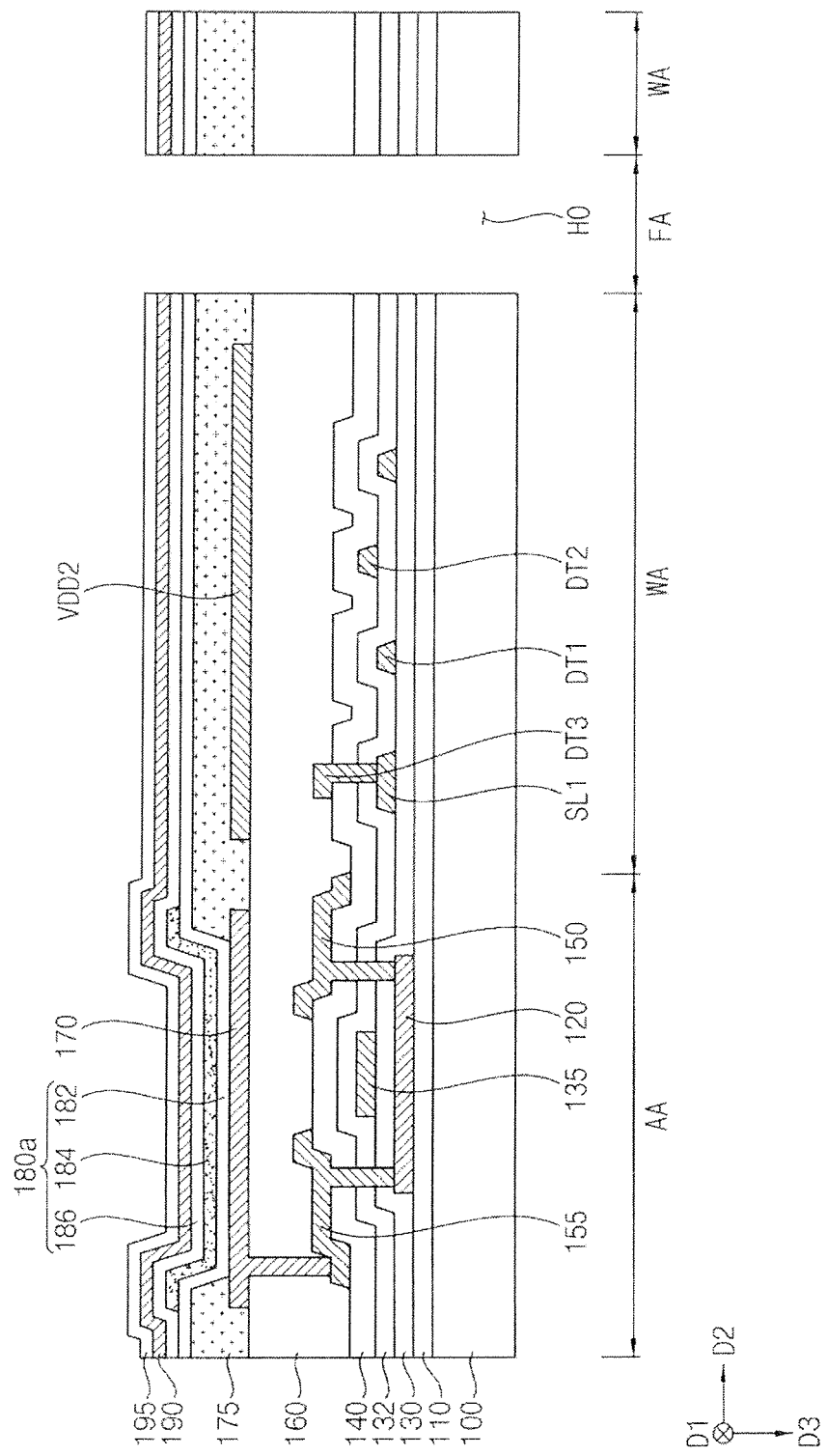
FIG. 11 is a cross-sectional view illustrating a display apparatus according to an exemplary embodiment of the present invention.

FIG. 11 is a cross-sectional view illustrating a display apparatus according to an exemplary embodiment of the present invention. Any repeated explanation for elements that are the same as or similar to those described in more detail with reference to FIG. 10 may be omitted.

Referring to FIG. 11, a light-emitting layer 180a may include a hole transport layer (HTL) 182, an organic light-emitting layer 184 and an electron transport layer (ETL) 186, which are sequentially disposed from an upper surface of the pixel electrode 170.

In an exemplary embodiment of the present invention, the hole transport layer 182 and the electron transport layer 186 may be disposed in the display area AA and the detour area WA. For example, the hole transport layer 182 and the electron transport layer 186 may be conformally disposed along surfaces of the pixel-defining layer 175 and the light-emitting layer 180.

As an example, the hole transport layer 182 may include a hole transport material such as 4,4'-bis[N-(1-naphthyl)-N-phenylamino]biphenyl(NPB), 4,4'-bis[N-(3-methylphenyl)-N-phenylamino]biphenyl(TPB), N,N-di-1-naphthyl-N,N-di-phenyl-1,1-biphenyl-4,4-diamine (NPD), or N-phenylcarbazole, polyvinylcarbazole.

As an example, the electron transport layer 186 may include an electron transport material such as tris(8-quinolinolato)aluminum (Alq3), 2-(4-biphenylyl)-5-(4-tert-butyl-phenyl-1,3,4-oxydiazole(PBD), bis(2-methyl-8-quinolinolato)-4-phenylphenolato-aluminum (BAlq), bathocuproine (BCP), triazole (TAZ), or phnylquinozaline.

In an exemplary embodiment of the present invention, the hole transport layer 182 and the electron transport layer 186 may be commonly provided for a plurality of the pixels in the display area AA.

The organic light-emitting layer 184 may be selectively formed in the display area AA. For example, the organic light-emitting layer 184 may substantially overlap the pixel electrode 170, and may be individually patterned for each of the pixels. The organic light-emitting layer 184 may be disposed between the hole transport layer 182 and the electron transport layer 186 in the display area AA.

The opposing electrode 190 and the encapsulation layer 195 may be continuously formed in the display area AA and the detour area WA.

FIGS. 12 to 21 are cross-sectional views illustrating a method for manufacturing a display apparatus according to an exemplary embodiment of the present invention.

Figure 12:
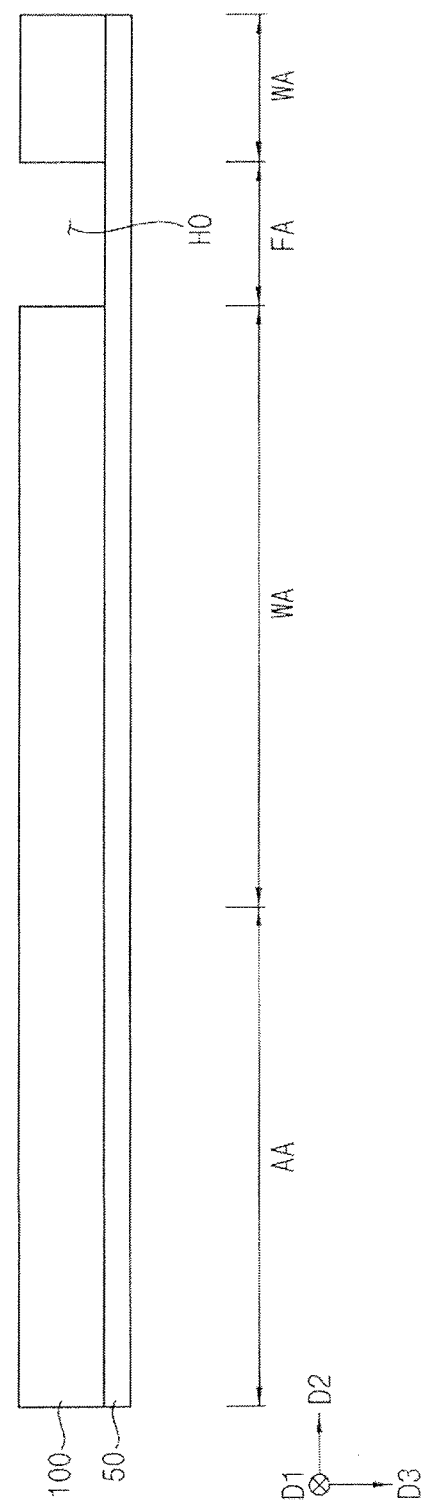
FIGS. 12 to 21 are cross-sectional views illustrating a method for manufacturing a display apparatus according to an exemplary embodiment of the present invention.

Referring to FIG. 12, the base substrate 100 may be formed on a carrier substrate 50.

The carrier substrate 50 may support the base substrate 100 in the process of manufacturing the display apparatus. For example, the carrier substrate 50 may be a glass substrate or a metal substrate.

The base substrate 100 may include a polymeric resin such as polyimide. For example, a composition including a polyimide precursor may be coated on the carrier substrate 50 through spin-coating to form a coating layer. The coating layer may be cured by heat to form the base substrate 100.

In an exemplary embodiment of the present invention, the base substrate 100 may be a glass substrate or a quartz substrate.

The base substrate 100 may include the opening HO for adding function. A portion of the base substrate 100 may define the display area AA. A remaining portion of the base substrate 100 except for the opening HO and the display area AA may define the peripheral area PA and the detour area WA.

The following processes may be performed with the base substrate 100 including the opening HO; however, exemplary embodiments of the present invention are not limited thereto. For example, the opening HO may be formed through patterning or punching, after the display apparatus is manufactured.

Figure 13:
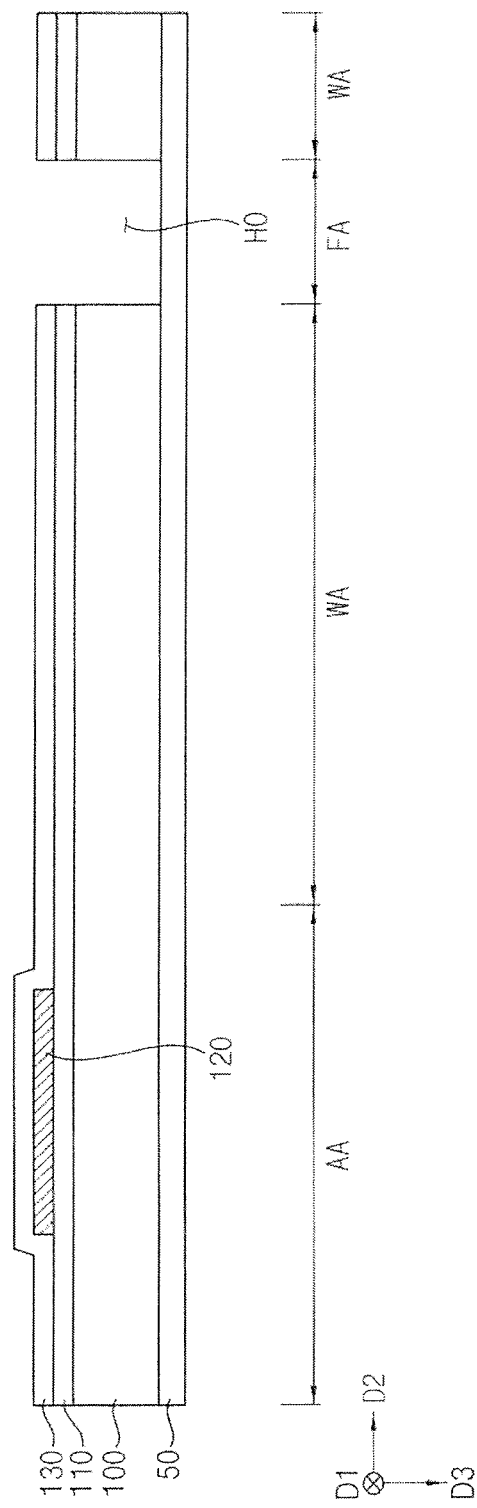

Referring to FIG. 13, the barrier layer 110, the active pattern 120 and the first gate insulation layer 130 may be sequentially formed on the base substrate 100.

The barrier layer 110 may substantially entirely cover an upper surface of the base substrate 100. For example, the barrier layer 110 may include silicon oxide, silicon nitride, or silicon oxynitride.

The active pattern 120 may be formed on the barrier layer 110 in the display area AA. For example, a semiconductor layer including amorphous silicon or polysilicon may be formed on the barrier layer 110, and then patterned to form the active pattern 120.

In an exemplary embodiment of the present invention, after the semiconductor layer is formed, a low temperature polycrystalline silicon (LTPS) process or a laser annealing process may be performed to crystallize silicon.

In an exemplary embodiment of the present invention, the semiconductor layer may include a semiconductive oxide such as IGZO, ZTP, or ITZO.

The first gate insulation layer 130 may be formed on the barrier layer 110 and may cover the active pattern 120. The first gate insulation layer 130 may be continuously formed in the display area AA and the detour area WA. The first gate insulation layer 130 may include silicon oxide, silicon nitride, or silicon oxynitride.

Figure 14:
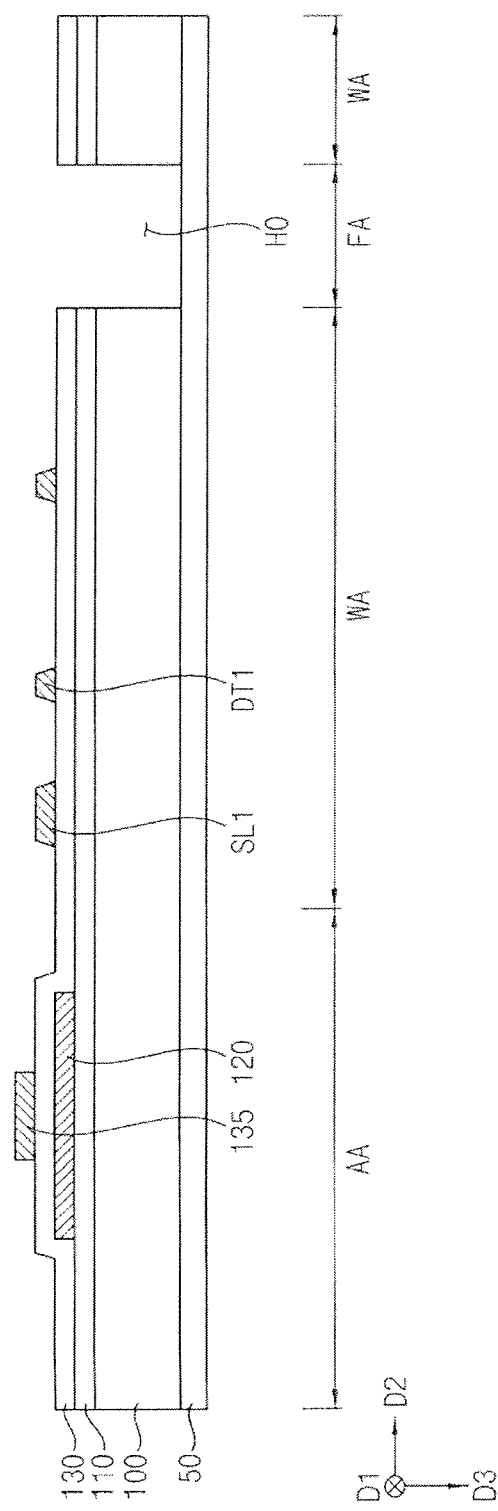

Referring to FIG. 14, a first gate pattern including the first detour line DT1, the gate electrode 135 and the scan line SL1 may be formed on the first gate insulation layer 130.

For example, a first gate metal layer may be formed on the first gate insulation layer 130. The first gate metal layer may be patterned through a photolithography to form the first gate pattern. The first detour line DT1 may be disposed in the detour area WA. The gate electrode 135 and the scan line SL1 may be disposed in the display area AA.

The first gate metal layer may include a metal, a metal alloy, or a metal nitride. The first gate metal layer may include stacked metal layers.

Figure 15:
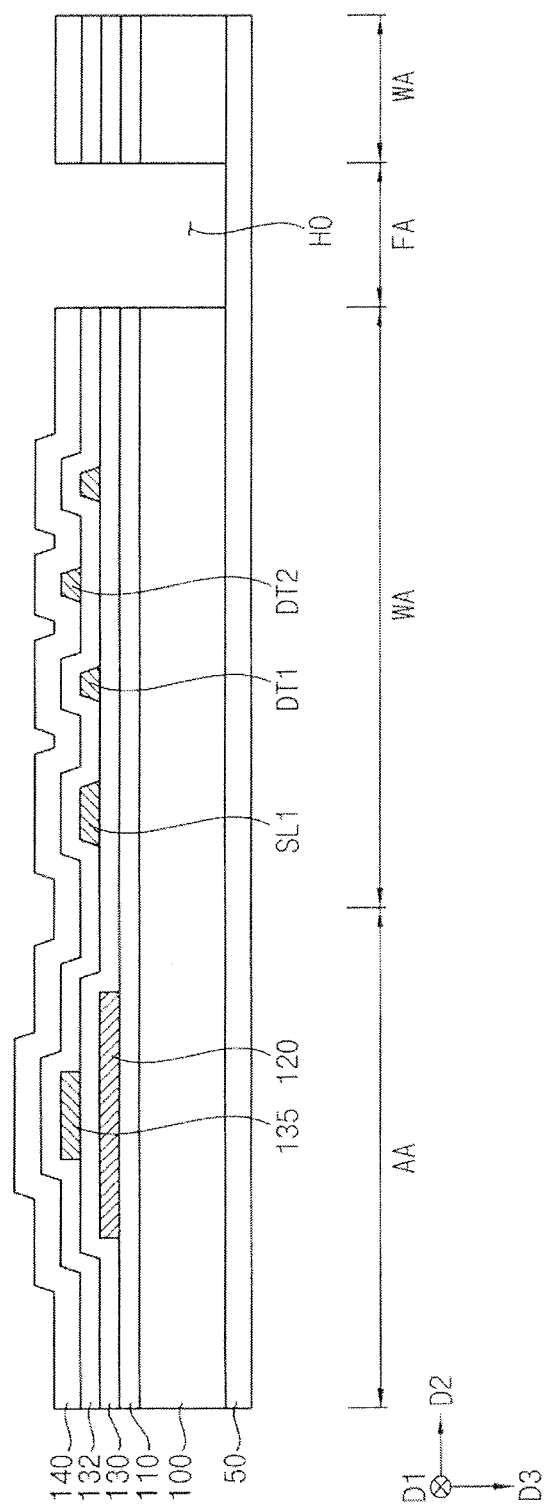

Referring to FIG. 15, the second gate insulation layer 132 may be formed to cover the first detour line DT1, the gate electrode 135 and the scan line SL1. A second gate pattern including the second detour line DT2 may be formed on the second gate insulation layer 132. The interlayer insulation layer 140 may be formed to cover the second detour line DT2.

The second gate insulation layer 132 may extend continuously in the display area AA and the detour area WA. The interlayer insulation layer 140 may include silicon oxide, silicon nitride, or silicon oxynitride.

As an example, a second gate metal layer may be formed on the second gate insulation layer 132. The second gate metal layer may be patterned by a photolithography process to form the second gate pattern including the second detour line DT2. The second gate metal layer may include a metal, a metal alloy, or a metal nitride. The second gate metal layer may include stacked metal layers.

In an exemplary embodiment of the present invention, the second gate pattern may include a storage electrode overlapping the gate electrode 135.

Figure 16:
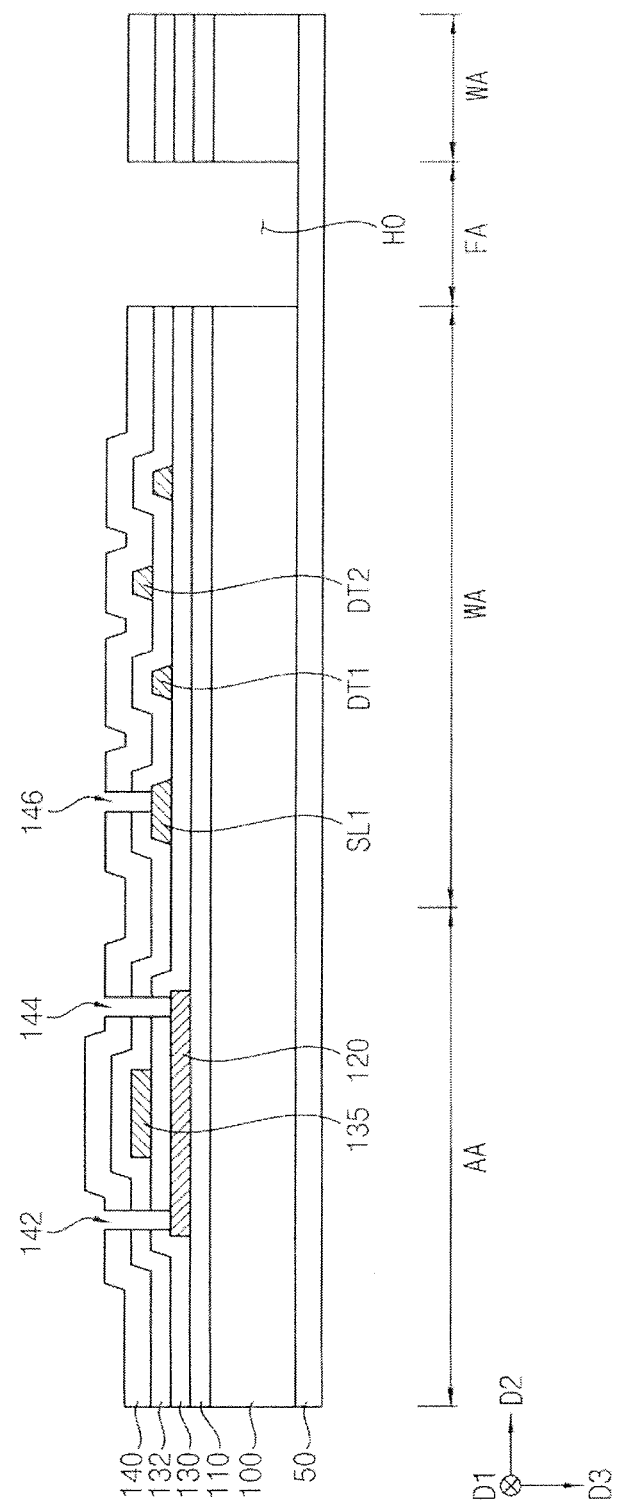

Referring to FIG. 16, the interlayer insulation layer 140 may be partially removed to form a first contact hole 142, a second contact hole 144 and a third contact hole 146.

In an exemplary embodiment of the present invention, the first contact hole 142, the second contact hole 144 and the third contact hole 146 may be formed in a same photolithography process using a same mask.

The first contact hole 142 and the second contact hole 144 may pass through the interlayer insulation layer 140 and the first and second gate insulation layers 130 and 132 to partially expose an upper surface of the active pattern 120. As an example, a source region and a drain region of the active pattern 120 may be exposed through the first contact hole 142 and the second contact hole 144, respectively.

The third contact hole 146 may pass through the interlayer insulation layer 140 and the second gate insulation layer 132 to expose an upper surface of the scan line SL1.

A contact hole passing through the interlayer insulation layer 140 and the second gate insulation layer 132 to expose an upper surface of the first detour line DT1 may be formed. A contact hole passing through the interlayer insulation layer 140 to expose an upper surface of the second detour line DT2 may be formed.

Figure 17:
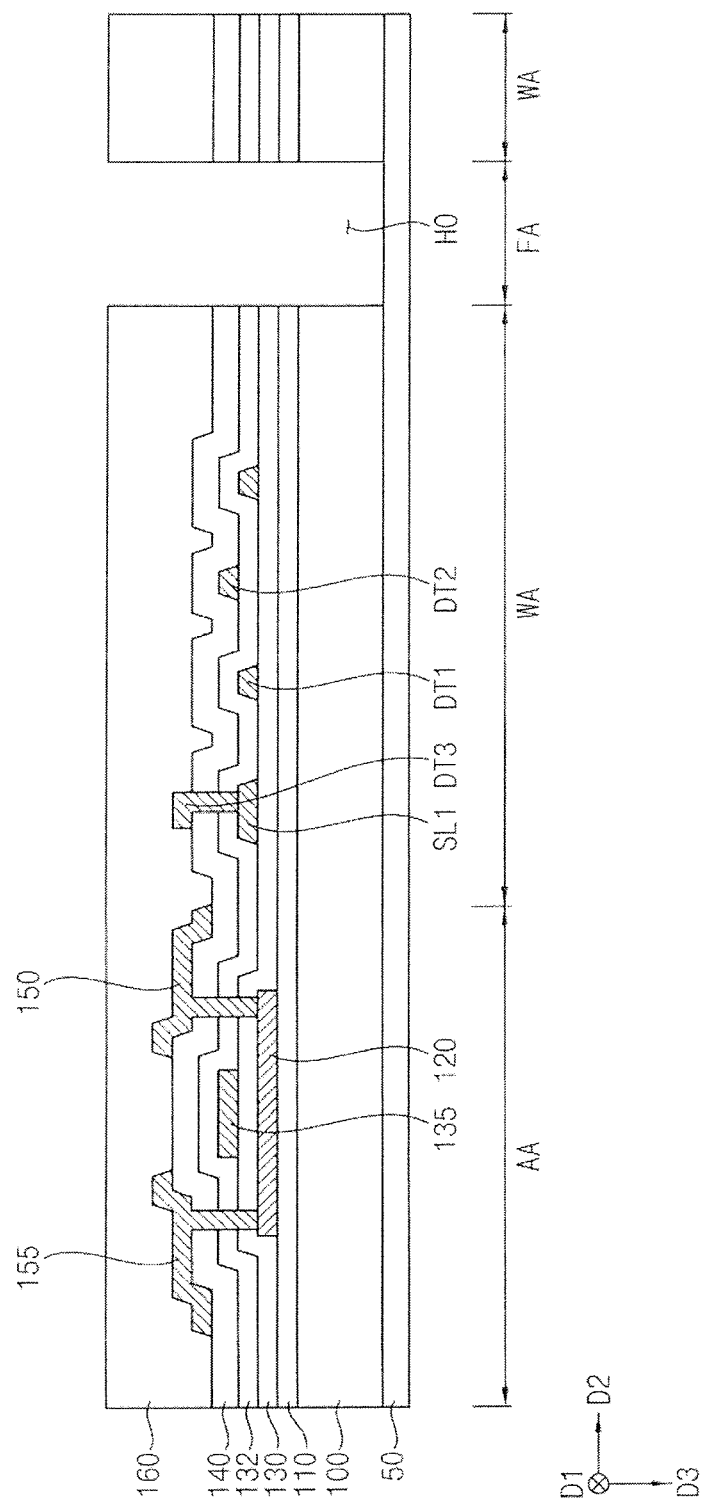

Referring to FIG. 17, a source pattern including the source electrode 150 and the drain electrode 155 may be formed. The source electrode 150 and the drain electrode 155 may contact the source region and the drain region of the active pattern 120 through the first contact hole 142 and the second contact hole 144, respectively.

In an exemplary embodiment of the present invention, the source pattern may include a third detour line DT3. The third detour line DT3 may be formed in the detour area WA, and may contact the scan line SL1 through the third contact hole 146.

The source pattern may include at least one data line. In an exemplary embodiment of the present invention, a first data line may contact the first detour line DT1, and a second data line may contact the second detour line DT2.

The source pattern may include a power line and a power bus line. The power line may be disposed in the display area AA, and may extend in a direction parallel with the data lines. The power bus line may be disposed in the peripheral area PA, and may extend in a direction parallel with the scan line SL1.

As an example, a source metal layer may be formed on the interlayer insulation layer 140, and then patterned through a photolithography process to form the source pattern. The source metal layer may include a metal, a metal alloy, or a metal nitride. The source metal layer may include stacked metal layers.

The via insulation layer 160 may be formed to cover the source pattern. The via insulation layer 160 may have a substantially flat upper surface.

As an example, the via insulation layer 160 may be formed from an organic material such as polyimide, epoxy resin, acrylic resin, or polyester through spin-coating or slit-coating.

Figure 18:
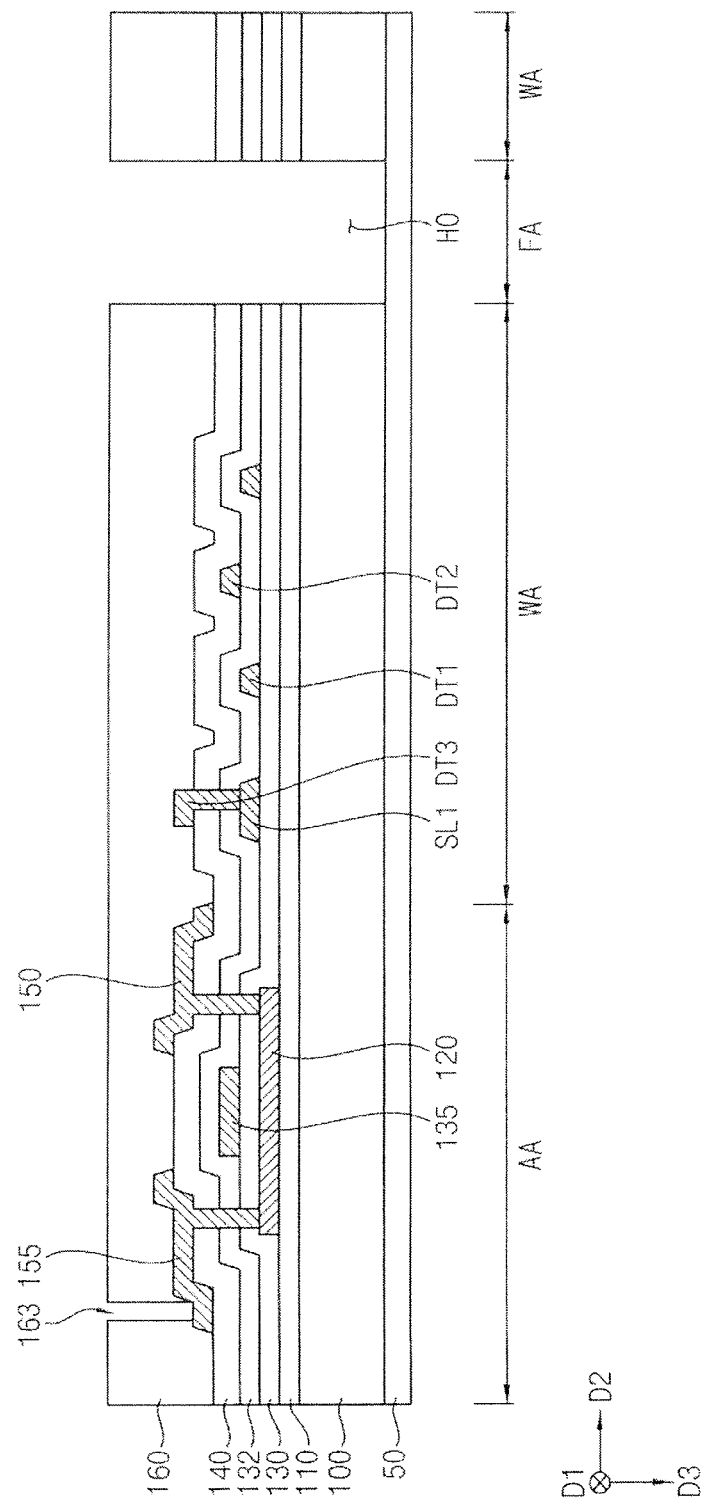

Referring to FIG. 18, the via insulation layer 160 may be partially etched to form a first via hole 163. An upper surface of the drain electrode 155 may be exposed through the first via hole 163.

The via insulation layer 160 may be partially etched to form a second via hole exposing an upper surface of the power line and the power bus line.

Figure 19:
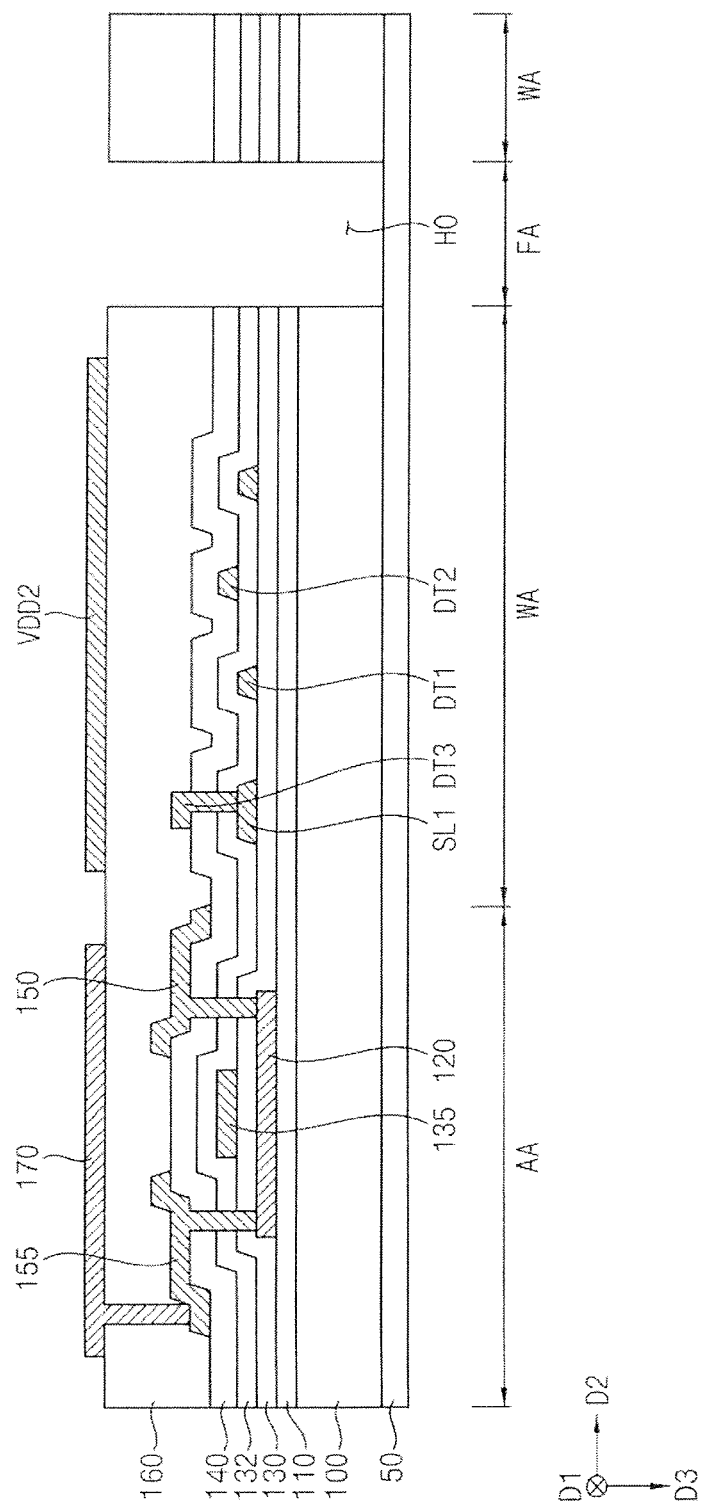

Referring to FIG. 19, the pixel electrode 170 and the detour bus line VDD2 are formed on the via insulation layer 160. The pixel electrode 170 may be electrically connected to the drain electrode 155. The detour bus line VDD2 may be formed in the detour area WA, and may be electrically connected to the power line and the power bus line.

As an example, a pixel metal layer may be formed on the via insulation layer 160, and then patterned through a photolithography process to form the pixel electrode 170 and the detour bus line VDD2.

The pixel metal layer may include a metal, a metal alloy, a metal nitride, or a transparent conductive material such as ITO.

Figure 20:
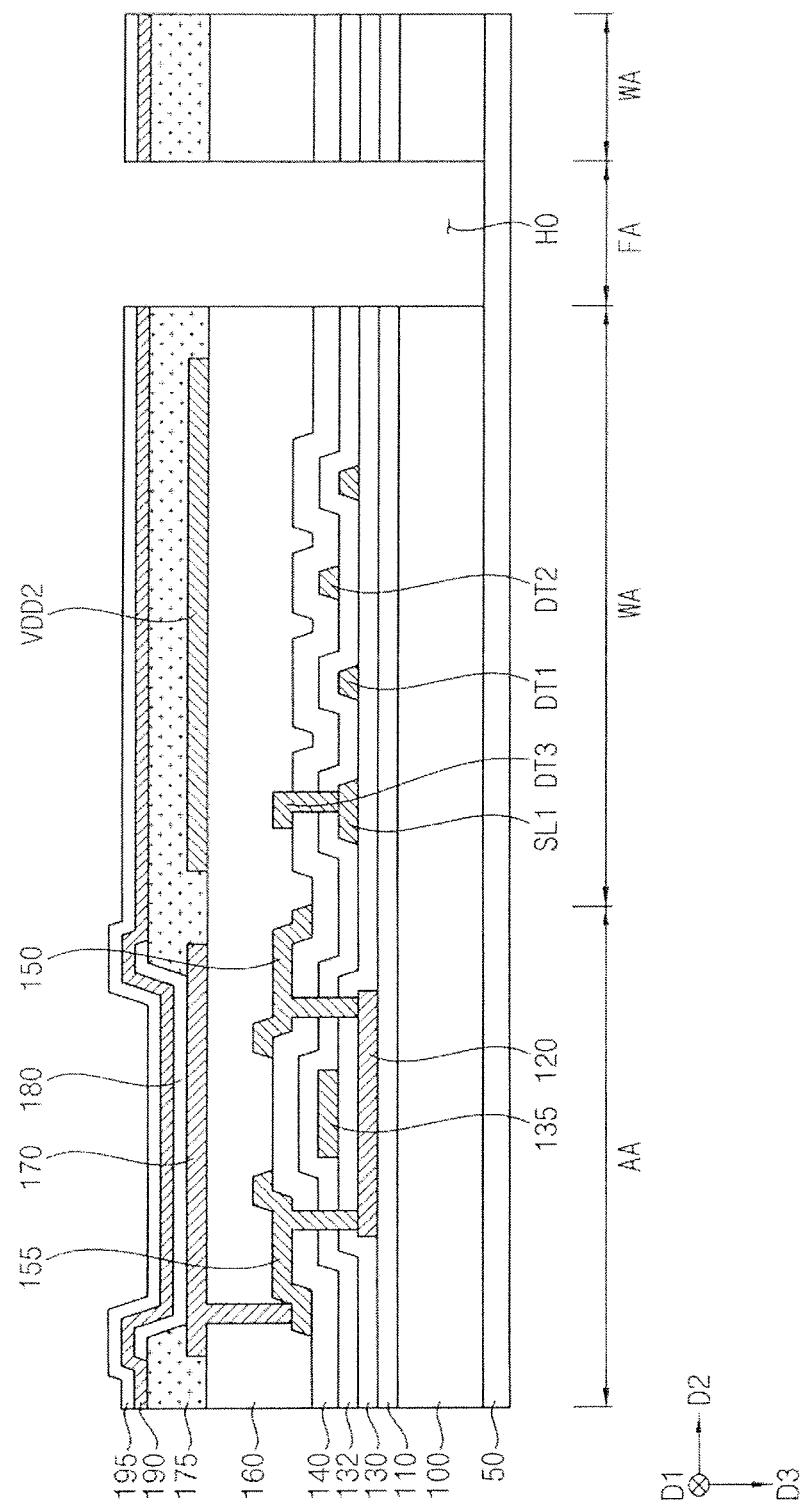

Referring to FIG. 20, a light-emitting structure may be formed on the display substrate.

The pixel-defining layer 175 may be formed on the via insulation layer 160 in the display area AA, for example, to cover a peripheral portion of the pixel electrode 170. For example, the pixel-defining layer 175 may be formed by coating a photosensitive organic material including polyimide resin or acrylic resin, exposing a coating layer to light and developing the coating layer.

The light-emitting layer 180 may include at least one of a hole injection layer, a hole transport layer, an organic light-emitting layer, an electron transport layer and an electro injection layer.

As an example, the light-emitting layer 180 may be formed on each pixel electrode 170 exposed through an opening of the pixel-defining layer 175 by using an organic light-emitting material for emitting a red light, a green light or a blue light. For example, the light-emitting layer 180 may be formed through a spin-coating process, a role-printing process, a nozzle-printing process, or an inkjet-printing process by using a fin metal mask including openings that expose regions where a red pixel, a green pixel and a blue pixel are formed. Thus, an organic light-emitting layer including an organic light-emitting material may be formed on each pixel.

In an exemplary embodiment of the present invention, the light-emitting layer 180 may be formed continuously in the display area AA. The light-emitting layer 180 may be a stacked structure including a green light-emitting layer, a red light-emitting layer and a blue light-emitting layer to emit a white light.

As an example, a metal having a low work function such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) or scandium (Sc), magnesium (Mg), or an alloy thereof may be deposited to form an opposing electrode 190. The opposing electrode 190 may include a transparent conductive material such as indium tin oxide, indium zinc oxide, zinc oxide, or indium oxide.

An inorganic material such as silicon oxide, silicon nitride, or a metal oxide may be deposited on the opposing electrode 190 to form the encapsulation layer 195. The encapsulation layer 195 may extend continuously in the display area AA and the detour area WA.

The carrier substrate 50 may be separated from the base substrate 100 to manufacture the display apparatus according to an exemplary embodiment of the present invention (e.g., the display apparatus described with reference to FIG. 10). The carrier substrate 50 may be separated from the base substrate 100 through a laser-lifting process or by a mechanical tensile force applied thereto.

Figure 21:
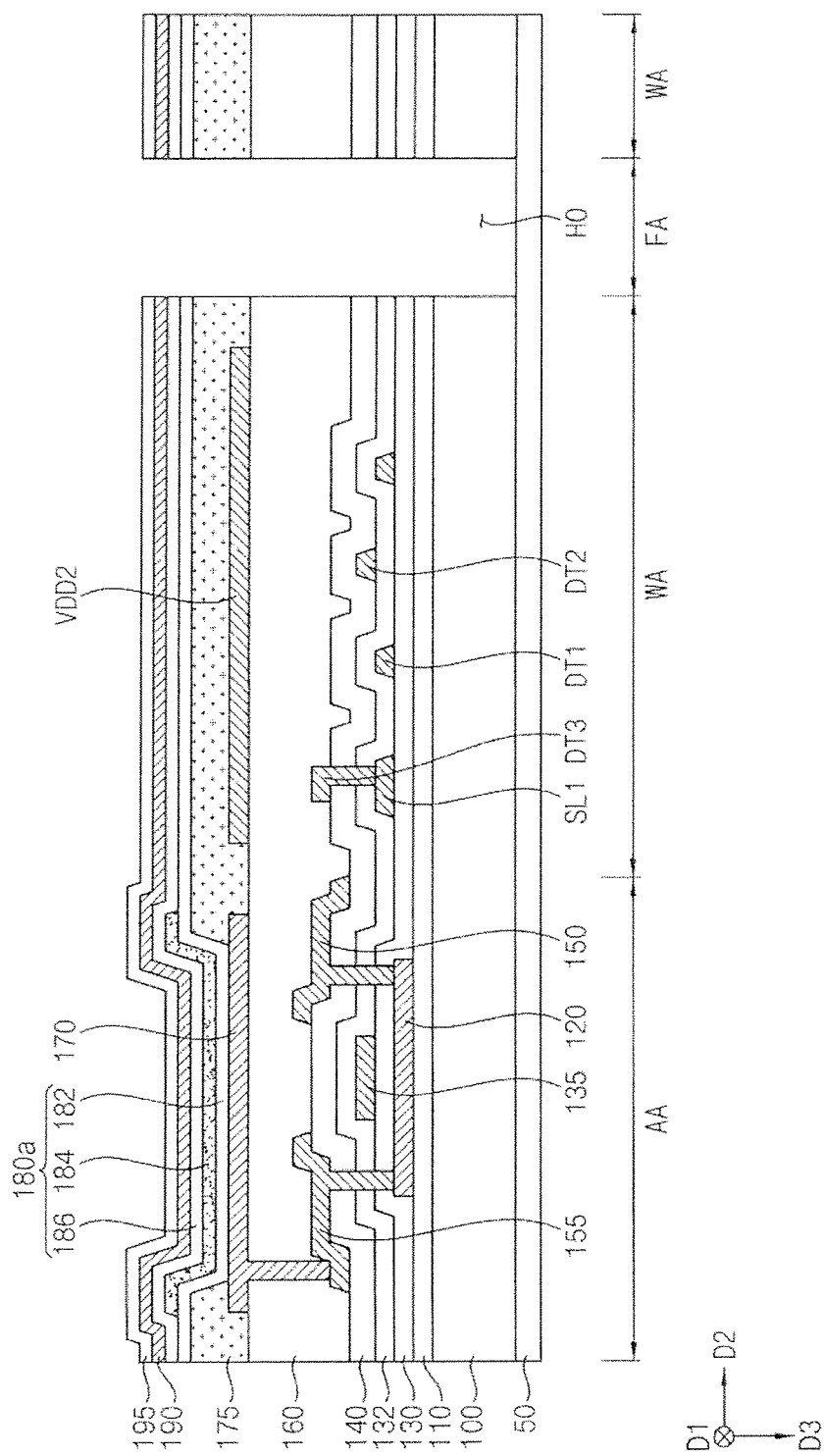

Referring to FIG. 21, the light-emitting layer 180a may include the hole transport layer 182, the organic light-emitting layer 184 and the electron transport layer 186, which may be formed sequentially on the display substrate.

The organic light-emitting layer 184 may be formed by printing a light-emitting material using a fine metal mask that selectively exposes a pixel in the display area AA after the hole transport layer 182 is formed.

The carrier substrate 50 may be separated from the base substrate 100 to manufacture the display apparatus according to an exemplary embodiment of the present invention (e.g., the display apparatus described with reference to FIG. 11).

A display substrate and a display apparatus according to some exemplary embodiments of the present invention may be used for a mobile display. For example, a display substrate and a display apparatus according to some exemplary embodiments of the present invention may be used for a computer, a mobile phone, a smart phone, a smart pad, an MP3 player, a navigator for a vehicle or a heads-up display.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display apparatus comprising:
    a substrate including a display area, a peripheral area surrounding the display area, a function-adding area, of which at least a portion is surrounded by the display area, and a detour area disposed between the display area and the function-adding area;
    a plurality of pixel circuits disposed in the display area;
    a plurality of driving lines electrically connected to the pixel circuits and extending in a first direction in the display area;
    a first detour line disposed in the detour area and electrically connected to a first driving line and disposed in a different layer from the first driving line; and
    a second detour line disposed in the detour area and electrically connected to a second driving line and disposed in a different layer from the first detour line and the second driving line.

2. The display apparatus of claim 1, wherein the first and second detour lines are adjacent to an edge of the function-adding area in a plan view.

3. The display apparatus of claim 1, wherein the first and second detour lines are alternatingly arranged in a second direction crossing the first direction.

4. The display apparatus of claim 1, wherein the driving lines include data lines.

5. A display apparatus, comprising:
    a substrate including a display area, a peripheral area surrounding the display area, a function-adding area, of which at least a portion is surrounded by the display area, and a detour area disposed between the display area and the function-adding area;
    a plurality of pixel circuits disposed in the display area;
    a plurality of driving lines electrically connected to the pixel circuits and extending in a first direction in the display area, wherein the driving lines include data lines;
    a first detour line disposed in the detour area and electrically connected to a first driving line;
    a second detour line disposed in the detour area and electrically connected to a second driving line and disposed in a different layer from the first detour line;
    a scan line electrically connected to the pixel circuits in the display area and extending in a second direction crossing the first direction; and
    a third detour line electrically connected to the scan line and disposed in the detour area.

6. The display apparatus of claim 5, wherein the third detour line is disposed in a different layer from the scan line.

7. The display apparatus of claim 6, wherein the scan line includes a first portion and a second portion spaced apart from the first portion by the detour area, and wherein the third detour line electrically connects the first portion to the second portion.

8. The display apparatus of claim 5, wherein the scan line is electrically connected to a gate electrode of a switching transistor that receives a data signal through at least one of the data lines.

9. The display apparatus of claim 5, further comprising:
    a power line electrically connected to the pixel circuits and extending in the first direction in the display area;
    a power bus line extending in the second direction in the peripheral area; and
    a detour bus line disposed in the detour area and electrically connecting the power line to the power bus line.

10. The display apparatus of claim 9, wherein the detour bus line is adjacent to an edge of the function-adding area in a plan view.

11. The display apparatus of claim 10, wherein the power bus line includes a first portion and a second portion spaced apart from the first portion by the detour area, and wherein the detour bus line electrically connects the first portion to the second portion.

12. The display apparatus of claim 9, further comprising an insulation structure that covers the pixel circuits and is disposed in the display area and the detour area, the insulation structure comprising a gate insulation layer, an interlayer insulation layer and a via insulation layer, which are sequentially disposed above the substrate,
    wherein each of the pixel circuits comprises:
    an active pattern disposed under the gate insulation layer;
    a gate electrode disposed on the gate insulation layer and overlapping the active pattern;
    a source electrode disposed on the interlayer insulation layer and electrically connected to the active pattern;
    a drain electrode spaced apart from the source electrode; and
    a pixel electrode disposed on the via insulation layer and electrically connected to the drain electrode.

13. The display apparatus of claim 12, wherein the gate insulation layer includes a first gate insulation layer and a second insulation layer disposed on the first gate insulation layer, and
wherein the first detour line is disposed on the first gate insulation layer, and the second detour line is disposed on the second gate insulation layer.

14. The display apparatus of claim 12, wherein the third detour line is disposed between the interlayer insulation layer and the via insulation layer.

15. The display apparatus of claim 14, wherein the detour bus line is disposed on the via insulation layer.

16. The display apparatus of claim 9, wherein the first and second detour lines extend into the peripheral area and cross the power bus line.

17. The display apparatus of claim 4, further comprising:
a power line electrically connected to the pixel circuits and extending in the first direction in the display area;
a power bus line extending in a second direction in the peripheral area;
a detour bus line disposed in the detour area and electrically connecting the power line to the power bus line; and
an insulation structure that covers the pixel circuits and is disposed in the display area and the detour area, the insulation structure comprising a gate insulation layer, an interlayer insulation layer and a via insulation layer, which are sequentially disposed above the substrate,
wherein the power line, the power bus line and the detour bus line are disposed between the interlayer insulation layer and the via insulation layer.

18. A display apparatus, comprising:
a substrate including a display area, a peripheral area surrounding the display area, a function-adding area, of which at least a portion is surrounded by the display area, and a detour area disposed between the display area and the function-adding area;
a plurality of pixel circuits disposed in the display area;
a plurality of driving lines electrically connected to the pixel circuits and extending in a first direction in the display area;
a first detour line disposed in the detour area and electrically connected to a first driving line; and
a second detour line disposed in the detour area and electrically connected to a second driving line and disposed in a different layer from the first detour line,
wherein the function-adding area is defined by an opening passing through the substrate.

19. A display apparatus, comprising:
a substrate including a display-area, a peripheral-area surrounding the display area, a function-adding area, of which at least a portion is surrounded by the display area, and a detour area disposed between the display area and the function-adding area;
a plurality of pixel circuits disposed in the display area;
a plurality of driving lines electrically connected to the pixel circuits and extending in a first direction in the display area;
a first detour line disposed in the detour area and electrically connected to a first driving line; and
a second detour line disposed in the detour area and electrically connected to a second driving line and disposed in a different layer from the first detour line; and
a light-emitting layer electrically connected to the pixel circuits.

20. A display apparatus comprising:
a substrate comprising a display area, a peripheral area and a detour area;
a hole formed in the substrate and overlapping a portion of the display area and a portion of the peripheral area, wherein the detour area is adjacent to the hole in the display area;
at least one pixel comprising a pixel circuit disposed in the display area;
a first data line disposed in the display area;
a second data line disposed in the display area;
a first detour line disposed in the detour area and electrically connected to the first data line;
a second detour line disposed in the detour area and electrically connected to the second data line, wherein the first and second detour lines are disposed in different layers from each other;
a first power voltage line disposed in the peripheral area, wherein the first power voltage line comprises a first portion disposed on a first side of the detour area and a second portion disposed on a second side of the detour area opposite the first side of the detour area; and
a detour bus line disposed in the detour area, wherein the detour bus line connects the first portion of the first power voltage line with the second portion of the first power voltage line.

21. The display apparatus of claim 20, wherein the pixel circuit of the at least one pixel comprises:
an active pattern disposed under a gate insulation layer;
a gate electrode disposed on the gate insulation layer and overlapping the active pattern;
a source electrode disposed on an interlayer insulation layer and electrically connected to the active pattern;
a drain electrode spaced apart from the source electrode; and
a pixel electrode disposed on the via insulation layer and electrically connected to the drain electrode.

22. The display apparatus of claim 20, wherein the first and second data lines extend in a first direction, and wherein the first and second portions of the first power voltage line extend in a second direction perpendicular to the first direction.

23. The display apparatus of claim 20, further comprising:
a scan line electrically connected to the pixel circuit of the at least one pixel in the display area; and
a third detour line electrically connected to the scan line and disposed in the detour area.

24. The display apparatus of claim 23, wherein the third detour line is disposed on a different level from the first detour line.

* * * * *